United States Patent
LePoudre

(10) Patent No.: US 11,737,239 B2
(45) Date of Patent: Aug. 22, 2023

(54) BLENDED OPERATION MODE FOR PROVIDING COOLING TO A HEAT LOAD

(71) Applicant: Nortek Air Solutions Canada, Inc., Saskatoon (CA)

(72) Inventor: Philip Paul LePoudre, Saskatoon (CA)

(73) Assignee: Nortek Air Solutions Canada, Inc., Saskatoon (CA)

(*) Notice: Subject to any disclaimer, the term of this patent is extended or adjusted under 35 U.S.C. 154(b) by 0 days.

(21) Appl. No.: 17/697,612

(22) Filed: Mar. 17, 2022

(65) Prior Publication Data
US 2022/0210948 A1 Jun. 30, 2022

Related U.S. Application Data

(63) Continuation of application No. 16/764,702, filed as application No. PCT/CA2018/051461 on Nov. 16, 2018, now Pat. No. 11,304,335.
(Continued)

(51) Int. Cl.
*F24F 5/00* (2006.01)
*H05K 7/20* (2006.01)
*G06F 1/20* (2006.01)

(52) U.S. Cl.
CPC ....... *H05K 7/20309* (2013.01); *F24F 5/0017* (2013.01); *F24F 5/0035* (2013.01);
(Continued)

(58) Field of Classification Search
CPC ........ F24F 5/0035; F24F 11/83; F24F 3/1405; F24F 2003/1435; F24F 12/002;
(Continued)

(56) References Cited

U.S. PATENT DOCUMENTS 4,538,426 A * 9/1985 Bock ............... F24F 5/0035
261/151
7,093,452 B2 * 8/2006 Chee ............... F24F 3/044
62/305
(Continued)

FOREIGN PATENT DOCUMENTS

CN 102192621 A 9/2011
CN 203908117 U 10/2014
(Continued)

OTHER PUBLICATIONS

"U.S. Appl. No. 16/764,702, Corrected Notice of Allowability dated Mar. 3, 2022", 3 pgs.
(Continued)

*Primary Examiner* — Mandeep S Buttar
(74) *Attorney, Agent, or Firm* — Schwegman Lundberg & Woessner, P.A.

(57) ABSTRACT

Conditioning systems and methods for providing cooling to a heat load can include an evaporative cooler arranged in a scavenger plenum with a recovery coil downstream of the evaporative cooler. The conditioning systems can operate in various modes, including an adiabatic mode and an evaporative mode, depending on outdoor air conditions. The systems can operate in a blended mode between the adiabatic mode and the evaporative mode by varying the distribution of return water from the recovery coil into at least partially isolated sections of a storage tank, and selectively directing cold water from the evaporative cooler into the tank. The mix of warm and cold water exiting the tank can be varied to maintain the cold-water supply at or near a set point temperature for the heat load. In an example, the systems can include a pre-cooler in the plenum upstream of the evaporative cooler for pre-conditioning the scavenger air.

15 Claims, 9 Drawing Sheets

Related U.S. Application Data

(60) Provisional application No. 62/588,153, filed on Nov. 17, 2017.

(52) U.S. Cl.
CPC ............ *G06F 1/20* (2013.01); *H05K 7/20327* (2013.01); *H05K 7/20381* (2013.01); *H05K 7/20827* (2013.01); *G06F 2200/201* (2013.01)

(58) Field of Classification Search
CPC ........ F24F 11/46; F24F 1/0007; F24F 5/0003; F24F 11/84; F24F 12/006; F25B 2339/047; F25B 25/005; F25B 49/02; F25B 2600/112; F25B 2700/2106; G06F 1/20; G06F 2200/201; G06F 1/206; H05K 7/20309; H05K 7/20381; H05K 7/20827; H05K 7/20327
USPC ................ 165/164, 104.11, 104.21, 104.33; 361/700
See application file for complete search history.

(56) References Cited

U.S. PATENT DOCUMENTS

| | | | |
|---|---|---|---|
| 9,091,496 | B2 | 7/2015 | Imwalle et al. |
| 9,278,303 | B1 | 3/2016 | Somani et al. |
| 11,304,335 | B2 | 4/2022 | Lepoudre |
| 11,375,641 | B2 | 6/2022 | Lepoudre et al. |
| 2005/0086958 | A1* | 4/2005 | Walsh ............... F24F 11/52 62/201 |
| 2010/0058778 | A1 | 3/2010 | Bhatti et al. |
| 2011/0023506 | A1 | 2/2011 | Day et al. |
| 2013/0061624 | A1 | 3/2013 | Zwinkels |
| 2014/0260369 | A1 | 9/2014 | Lepoudre et al. |
| 2015/0369527 | A1* | 12/2015 | Ghadiri Moghaddam ............. F24F 3/1423 62/305 |
| 2017/0356661 | A1* | 12/2017 | Fischer ............... F24F 3/153 |
| 2018/0073753 | A1 | 3/2018 | Lepoudre et al. |
| 2018/0012851 | A1 | 5/2018 | Lepoudre et al. |
| 2018/0128510 | A1* | 5/2018 | LePoudre ............ H05K 7/2079 |
| 2019/0113247 | A1* | 4/2019 | Lepoudre ........... H05K 7/20827 |
| 2020/0284464 | A1* | 9/2020 | Abdel-Salam et al. . F24F 11/81 |
| 2020/0284480 | A1* | 9/2020 | Tolouei Asbforoushani ............. F25B 25/005 |
| 2020/0288602 | A1* | 9/2020 | LePoudre .......... H05K 7/20836 |
| 2020/0375060 | A1 | 11/2020 | Lepoudre et al. |
| 2021/0037677 | A1 | 2/2021 | Lepoudre |
| 2022/0279675 | A1 | 9/2022 | Lepoudre et al. |

FOREIGN PATENT DOCUMENTS

| | | |
|---|---|---|
| CN | 107208910 A | 9/2017 |
| CN | 112204335 A | 1/2021 |
| GB | 201306105 | 5/2013 |
| IN | 202017025172 A | 10/2020 |
| JP | 2003336866 A | 11/2003 |
| SG | 10202110166 | 10/2021 |
| WO | WO-2008138112 A1 | 11/2008 |
| WO | WO-2016183667 A1 | 11/2016 |
| WO | WO-2016183668 A1 | 11/2016 |
| WO | 2017097032 | 6/2017 |
| WO | WO-2017152268 A1 | 9/2017 |
| WO | WO-2019095070 A1 | 5/2019 |
| WO | WO-2021232136 A1 | 11/2021 |

OTHER PUBLICATIONS

"U.S. Appl. No. 16/764,702, Notice of Allowance dated Jul. 21, 2021", 11 pgs.

"U.S. Appl. No. 16/764,702, Notice of Allowance dated Aug. 18, 2021", 7 pgs.

"U.S. Appl. No. 16/764,702, Notice of Allowance dated Dec. 10, 2021", 8 pgs.

"U.S. Appl. No. 16/764,702, Preliminary Amendment filed May 15, 2020", 10 pgs.

"U.S. Appl. No. 16/882,440, Non Final Office Action dated Sep. 22, 2021", 9 pgs.

"U.S. Appl. No. 16/882,440, Notice of Allowance dated Feb. 15, 2022", 9 pgs.

"U.S. Appl. No. 16/882,440, Response filed Jan. 24, 2022 to Non Final Office Action dated Sep. 22, 2021", 12 pgs.

"Chinese Application Serial No. 201880086028.8, Office Action dated Dec. 2, 2021", with English translation, 21 pages.

"European Application Serial No. 18879884.7, Extended European Search Report dated Jul. 2, 2021", 13 pgs.

"European Application Serial No. 18879884.7, Response to Communication Pursuant to Rules 161 and 162 filed Jan. 11, 2021", 17 pgs.

"International Application Serial No. PCT/CA2018/051461, International Search Report dated Jan. 23, 2019", 4 pgs.

"International Application Serial No. PCT/CA2018/051461, Written Opinion dated Jan. 23, 2019", 5 pgs.

"Internalional Application Serial No. PCT/CA/2020/050702, International Search Report dated Jan. 29, 2021", 3 pgs.

"International Application Serial No. PCT/CA2020/050702, Written Opinion dated Jan. 29, 2021", 3 pgs.

U.S. Appl. No. 16/764,702, filed May 15, 2020, Blended Operation Mode for Providing Cooling to a Heat Load.

U.S. Appl. No. 16/882,440, filed May 23, 2020, Blended Operation Mode for Providing Cooling to a Heat Load.

"Indian Application Serial No. 202017025172, First Examination Report dated Apr. 28, 2022", 6 pgs.

"U.S. Appl. No. 16/882,440, Corrected Notice of Allowability dated Jun. 2, 2022", 3 pgs.

"U.S. Appl. No. 17/747,841, Non Final Office Action dated Jan. 19, 2023", 10 pgs.

"Chinese Application Serial No. 201880086028.8, Office Action dated Dec. 5, 2022", w/English Translation, 21 pgs.

"International Application Serial No. PCT/CA2020/050702, International Preliminary Report on Patentability dated Dec. 1, 2022", 5 pgs.

"U.S. Appl. No. 17/747,841, Notice of Allowance dated Jun. 8, 2023", 8 pgs.

"Chinese Application Serial No. 201880086028.8, Office Action dated May 19, 2023", w/o English Translation, 9 pgs.

* cited by examiner

BLENDED OPERATION MODE FOR PROVIDING COOLING TO A HEAT LOAD

CLAIM OF PRIORITY

This application is a continuation of U.S. Non-Provisional application Ser. No. 16/764,702, filed on May 15, 2020, which is a U.S. National Stage (371) Application which claims priority to Application Serial No. PCT/CA2018/051461, filed Nov. 16, 2018, and published on May 23, 2019 as WO 2019/095070 A1, which claims the benefit of U.S. Provisional Patent Application No. 62/588,153, filed on Nov. 17, 2017, the benefit of priority of which is claimed hereby, and which is incorporated by reference herein in its entirety.

BACKGROUND

The present application relates to conditioning systems and methods for providing cooling to a heat load. In an example, the heat load can be from an enclosed space, for example, a data center, and cooling can be provided by cooling the air or heat-generating components in the enclosed space with liquid or air cooling. In an example, the heat load can be from one or more devices or other piece of equipment that may or may not be arranged within an enclosed space.

There are many applications where cooling is critical, such as, for example, data centers. A data center usually consists of computers and associated components working continuously (24 hours per day, 7 days per week). The electrical components in a data center can produce a lot of heat, which then needs to be removed from the space. Air-conditioning systems in data centers can often consume more than 40% of the total energy.

With the current data centers' air-conditioning systems and techniques and significant improvements in IT components operating conditions and processing capacity, servers can roughly operate at 50% of their capacity. This capacity limitation is due, in part, to the cooling systems not being able to cool the servers efficiently and the servers reach their high temperature limit before reaching their maximum processing capacity. High density data center cooling seeks to cool servers more effectively and increase the density of the data centers. Consequently, this will result in savings in data center operating cost and will increase the data center overall capacity.

The high density data center cooling can be achieved by using liquid cooling technologies to reject the heat at the server. Data center liquid cooling affects the data center energy consumption in two ways: (1) utilizing maximum server processing capacity and data center processing density which will result in lower cooling power consumption per kW of processing power in the data center, and (2) generally liquid-cooling systems are more energy efficient than data centers air-cooling systems. The liquid cooling technology can capture up to 100% of the heat at the server which can eliminate the need for data centers air-cooling systems. The data center liquid cooling can save up to 90% in data centers cooling costs and up to 50% in data centers operating costs. Also, data center liquid cooling can increase the servers processing density by up to 100%, which can result in significant savings.

OVERVIEW

A conditioning system for providing cooling to a heat load can include an evaporative cooler in combination with a downstream recovery coil. The heat load can be from an enclosed space or from one or more devices. In an example, the conditioning system can produce cold water (or other type of cooling fluid) for providing liquid cooling or air cooling to the enclosed space. In an example, the conditioning system can produce cold water (or other type of cooling fluid) for providing liquid cooling to a device or other piece of equipment not arranged within an enclosed space.

The evaporative cooler and the recovery coil can be arranged inside a scavenger air plenum configured to receive an outdoor or scavenger air stream and direct the air stream through the plenum. The evaporative cooler can condition the outdoor air such that the conditioned air can pass through the recovery coil and cool water circulating through the recovery coil. The reduced-temperature water exiting the recovery coil can be used for liquid cooling or air cooling for the heat load. In some designs, a pre-cooler can be included in the conditioning system and can be located upstream of the evaporative cooler. The pre-cooler can be configured to selectively pre-condition the scavenger air depending on the outdoor air conditions.

The evaporative cooler can be any type of evaporative cooler configured to exchange energy between an air stream and a cooling fluid through evaporation of a portion of the fluid into the air. Evaporative coolers can include direct-contact evaporation devices in which the working air stream and the liquid water (or other fluid) stream that is evaporated into the air to drive heat transfer are in direct contact with one another. In what is sometimes referred to as "open" direct-contact evaporation devices, the liquid water may be sprayed or misted directly into the air stream, or, alternatively the water is sprayed onto a filler material or wetted media across which the air stream flows. As the unsaturated air is directly exposed to the liquid water, the water evaporates into the air, and, in some cases, the water is cooled.

The evaporative cooler can include liquid-to-air membrane energy exchangers. Unlike direct-contact evaporation devices, a liquid-to-air membrane energy exchanger (LAMEE) separates the air stream and the liquid water stream by a permeable membrane, which allows water to evaporate on the liquid water stream side of the membrane and water vapor molecules to permeate through the membrane into the air stream. The water vapor molecules permeated through the membrane saturate the air stream and the associated energy caused by the evaporation is transferred between the liquid water stream and the air stream by the membrane.

The inclusion and arrangement of the evaporative cooler and the downstream recovery coil allows the conditioning system to operate in multiple modes depending in part on the outdoor air conditions and an amount of cooling needed for the heat load. In an economizer mode, the evaporative cooler can be bypassed since the outdoor air conditions are such that the scavenger air does not need to be conditioned or cooled prior to the recovery coil. In an adiabatic mode, the evaporative cooler can operative with the evaporative fluid (water) in a closed fluid circuit confined to the evaporative cooler, and a temperature of the water can remain generally constant or have minimal temperature fluctuations. The outdoor air conditions in the adiabatic mode can be such that sufficient conditioning of the scavenger air stream can be provided by water in the tank through recirculation of the water in the closed fluid circuit. In a normal or evaporation mode, the evaporative cooler can be used to condition the scavenger air prior to the recovery coil. The evaporative cooler is not operating adiabatically in the evaporative mode and the fluid circuit of the evaporative cooler can be in fluid connection with the fluid circuit through the recovery coil.

The inclusion of a pre-cooler upstream of the evaporative cooler can allow for additional operating modes. The pre-cooler can be included in the conditioning system if the conditioning system is to be used in an environment with hot or humid conditions. The pre-cooler can selectively by operated depending on the outdoor air conditions. In an enhanced mode or super-evaporative mode, the pre-cooler can be used to pre-condition the scavenger air prior to passing the scavenger air through the evaporative cooler. The pre-cooler can also be used to pre-condition the scavenger air when the evaporative cooler is operating adiabatically.

The conditioning system can be referred to as operating in a "wet mode" whenever evaporation is occurring within the evaporative cooler. Thus the previously described adiabatic, evaporative and enhanced modes can also be referred to herein as a wet mode. The conditioning system can be controlled to run at the lowest operating mode (in terms of energy and water usage) that is sufficient for meeting the cooling requirements for the heat load.

Instead of switching entirely between the distinct modes of operation for the adiabatic mode and evaporation mode, the conditioning unit can include a blended mode operation. Such blended mode operation can include blending the adiabatic and evaporative modes together in differing ratios to control the mode transition and maintain optimal water efficiency. The transition between modes can involve significant changes in the operational state of the unit and can be difficult to control or avoid fluctuations in supply water temperature. The transition from the adiabatic mode to the evaporative mode can involve a sudden mixing of water or a sudden increase in cooling power as the evaporative coolers begin to receive warmer water and the evaporation rate increases significantly. This can result in the fan speed modulating from full speed (at the limit of the adiabatic mode) to a low speed in the evaporative mode to prevent over cooling. As the cooling load on the conditioning unit increases (when fewer conditioning units are selected for a given facility heat load), the conditioning unit can spend minimal time in the adiabatic mode and switch to the evaporative mode where it can develop sufficient cooling capacity. The evaporative mode can be less efficient in terms of water usage, relative to the adiabatic mode, and water consumption can increase.

The capability to operate in a blended mode can improve controllability of the conditioning system and can markedly improve water usage efficiency. The capital cost of the conditioning units can be balanced with water usage.

The present application is directed to methods and systems for operating the conditioning unit in a blended operation mode between the adiabatic mode and the evaporative mode. The blended mode can be achieved, in part, through controlling/varying the distribution of water from the recovery coil in order to control a supply water temperature to the heat load and an evaporation rate in the evaporative cooler.

Examples according to the present application can include conditioning systems for providing liquid or air cooling to a data center having IT components.

Examples according to the present application can include a liquid-cooling system for a data center, the liquid cooling system having a Liquid-to-Air Membrane Energy Exchanger (LAMEE) as an evaporative cooler, which can reduce the data center cooling energy consumption compared to conventional air cooling data centers techniques. The liquid cooling system can be significantly smaller in size and lighter compared to other direct evaporative coolers (DEC), including air-cooling DECs. The liquid-cooling system as described herein can reduce the water consumption in comparison with other evaporative cooling systems and can reduce the operating cost of the data center. Data centers liquid cooling can be effective since a typical liquid, such as water, at the same volume flow rate as air, has almost 350 times higher thermal capacity than the air. The system can include a cooling fluid circuit connected to the cooling fluid flow path of the LAMEE and recovery coil and extending from the plenum into the data center. The cooling fluid circuit can be used to deliver reduced temperature water from the LAMEE and recovery coil (or a reduced temperature coolant) to the data center to provide cooling to the data center without moving air from the data center through the cooling system.

Examples according to the present application can include an air-cooling system for a data center or other enclosed space, the air-cooling system having a LAMEE as an evaporative cooler. The LAMEE and the recovery coil can collectively produce cold water that can be used to cool a process air stream. A process air plenum can receive the hot process air from the enclosed space. The cold water from the LAMEE and the recovery coil can be delivered into the process air plenum to provide air cooling to the hot process air. In an example, the cold water can circulate through a liquid-to-air heat exchanger configured to cool the hot process air with the cold water.

Examples according to the present application can include a method of controlling operation of a conditioning system configured to provide cooling to a heat load, the conditioning system having an evaporative cooler and a downstream recovery coil arranged inside a scavenger plenum configured to direct scavenger air from an air inlet to an air outlet. The method can comprise selectively directing scavenger air through the evaporative cooler depending on outdoor air conditions, wherein the evaporative cooler circulates water through the evaporative cooler during operation of the evaporative cooler; directing the scavenger air through the recovery coil, wherein the recovery coil circulates water through the recovery coil; selectively directing discharge water exiting the evaporative cooler into a discharge area of a storage tank, the water from the tank used to provide cooling to the heat load; directing return water exiting the recovery coil into at least one of a first bay and a second bay of the tank, wherein a first pump is fluidly connected to a first outlet of the tank in proximity to the first bay and a second pump is fluidly connected to a second outlet of the tank in proximity to the second bay; selectively directing water out of the tank and back to the evaporative cooler via the second pump; directing supply water out of the tank and to the heat load via the first pump; and directing hot water exiting the heat load back to the recovery coil. The first and second bays are at least partially separated from one another, and the discharge area of the tank is fluidly connected to at least one of the first and second bays. In an example, the first and second bays can be part of the same structure and partially separated along a length of the tank. In an example, the first and second bays can be separate structures.

Examples according to the present application can include a conditioning system configured to provide cooling to a heat load, the system comprising: a scavenger plenum having an air inlet and air outlet, the scavenger plenum configured to direct scavenger air in an air flow path from the air inlet to the air outlet; an evaporative cooler arranged inside the scavenger plenum in the air flow path and having a first cooling fluid circuit configured to circulate a first cooling fluid through the evaporative cooler, the evaporative cooler configured to selectively evaporate a portion of the first cooling fluid when the conditioning system is operating in an adiabatic mode or an evaporative mode, and the evaporative cooler is off or bypassed when the conditioning system is operating in an economizer mode; a recovery coil arranged inside the scavenger plenum between the evaporative cooler and the air outlet and having a second cooling fluid circuit configured to circulate a second cooling fluid through the recovery coil, the recovery coil configured to reduce a temperature of the second cooling fluid using the scavenger air in the air flow path, wherein the recover coil provides sufficient cooling for the heat load in the economizer mode; and a tank for releasably storing the first and second cooling fluids for selective delivery of the cooling fluids to the heat load as supply water and to the evaporative cooler for recirculation, the tank comprising a first portion and a second portion, the first and second portions at least partially separated from one another, and the tank further comprising a discharge area in fluid connection with at least one of the first and second portions; and one or more modulating valves fluidly connecting the recovery coil and the tank, the one or more modulating valves configured to control and vary distribution of the second cooling fluid to the first and second portions of the tank based on the outdoor air conditions, wherein the first cooling fluid exiting the evaporative cooler is directed into the discharge area of the tank. In an example, the evaporative cooler is a liquid-to-air membrane energy exchanger (LAMEE), and the first cooling fluid is separated from the air flow path by a membrane, the LAMEE configured to condition the scavenger air and evaporatively cool the first cooling fluid. In an example, the first and second cooling fluids are water. In an example, the system further comprises a pre-cooler arranged inside the scavenger plenum between the air inlet and the evaporative cooler, the pre-cooler configured to selectively condition the scavenger air prior to passing the scavenger air through the evaporative cooler, based on the outdoor air conditions.

Examples according to the present application can include a method of operating a conditioning system configured to provide cooling to a heat load, the conditioning system comprising an evaporative cooler and a recovery coil arranged inside a scavenger air plenum configured to direct a scavenger air stream from an air inlet to an air outlet, the method comprising: operating the conditioning system in an economizer mode in which the evaporative cooler is off or bypassed and the scavenger air stream reduces a temperature of a first cooling fluid flowing through the recovery coil such that the first cooling fluid provides sufficient cooling to the heat load; releasably storing the first cooling fluid in a tank; directing the first cooling fluid exiting the recovery coil into at least one of a first portion and a second portion of the tank when the conditioning system is operating in the economizer mode, the first and second portions at least partially separated from one another, the first portion fluidly connected to a first pump for delivering supply water to the heat load and the second portion fluidly connected to a second pump for recirculating water to the evaporative cooler; operating the conditioning system in an adiabatic mode in which the evaporative cooler is on and the scavenger air stream passes through the evaporative cooler and the recovery coil, the evaporative cooler configured to evaporate a portion of a second cooling fluid flowing through the evaporative cooler, the evaporative cooler having a closed fluid circuit in the adiabatic mode; directing essentially all of the first cooling fluid exiting the recovery coil into the first portion of the tank when the conditioning system is operating in the adiabatic mode; operating the conditioning system in an evaporative mode in which the evaporative cooler is on and the scavenger air stream passes through the evaporative cooler and the recovery coil, wherein the second cooling fluid is in fluid connection with the first cooling fluid when the conditioning system operates in the evaporative mode; directing the second cooling fluid exiting the evaporative cooler into a discharge area of the tank when the conditioning system is operating in the evaporative mode; directing essentially all of the first cooling fluid exiting the recovery coil into the second portion of the tank when the conditioning system is operating in the evaporative mode, whereby the second cooling fluid flows from the discharge area of the tank into the first portion; and operating the conditioning system in a blended mode at particular operating conditions between the adiabatic mode and the evaporative mode, wherein operating the conditioning system in the blended mode comprises distributing the first cooling fluid exiting the recovery coil between the first and second portions of the tank in a ratio such that a mix of the first and second cooling fluids in the supply water delivered to the heat load is at a temperature at or near a set point temperature for the conditioning system. Operating in the blended mode can include continuously monitoring and varying the ratio of the first cooling fluid distributed to the first and second portions of the tank to maintain the temperature of the supply water at or near the set point temperature.

This overview is intended to provide an overview of subject matter in the present application. It is not intended to provide an exclusive or exhaustive explanation of the invention. The detailed description is included to provide further information about the present application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
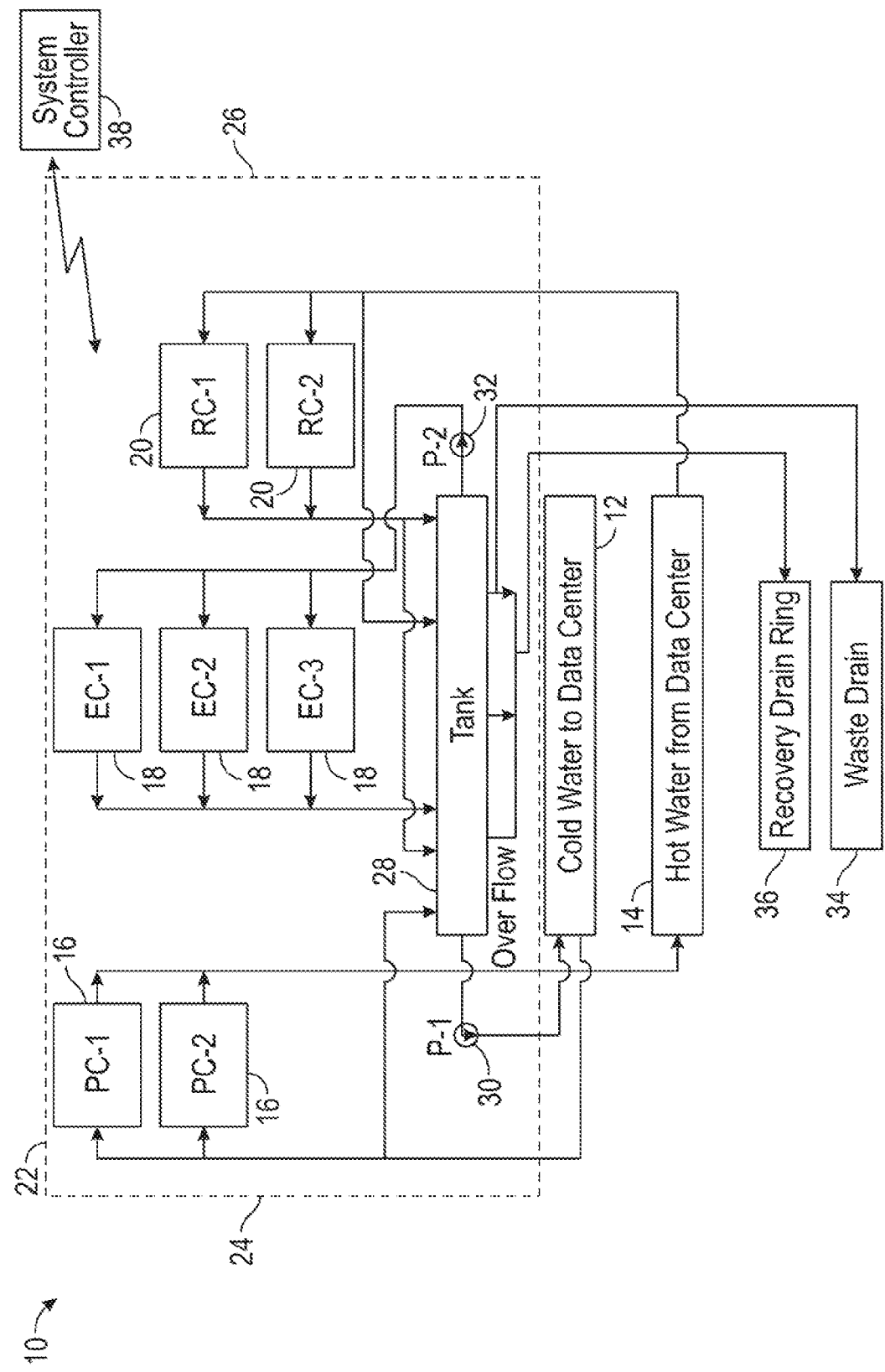
FIG. 1 is a schematic of an example conditioning unit for providing liquid cooling.

The present application relates to conditioning systems and methods for providing cooling to a heat load. The conditioning systems can include different operating modes and selection of a particular mode can depend on the outdoor air conditions. The present inventor(s) recognized that additional benefits can be achieved through operating the conditioning system under a blended operation mode rather than shifting entirely from one mode to another.

The heat load that needs cooling can be any type of device or system that generates heat. The device or system can be enclosed or open to the atmosphere. In an example, the heat load can be from a data center. The conditioning systems and methods of the present application include an evaporative cooler arranged in a scavenger air plenum with a pre-cooler arranged upstream of the evaporative cooler and a recovery coil arranged downstream of the evaporative cooler. The conditioning systems of the present application can use outdoor air (scavenger air) that can be conditioned in the evaporative cooler such that the scavenger air can provide cooling to a cooling fluid circulating through the recovery coil. The reduced-temperature cooling fluid exiting the recovery coil can be used to provide liquid cooling or air cooling to the heat load.

The design and arrangement of the three components (pre-cooler, evaporative cooler and recovery coil) in the scavenger air plenum can allow for the conditioning systems described herein to operate in multiple modes, depending in part on the outdoor air conditions. The recovery coil can be used in each of the modes to reduce a temperature of the cooling fluid. The evaporative cooler and pre-cooler can be optionally used, depending on the operating mode. In an example, the evaporative cooler can cool the scavenger air, as well as an evaporative fluid that can be collected and provide liquid cooling or air cooling in combination with the cooling fluid from the recovery coil. In another example, the evaporative cooler can be configured primarily to condition the scavenger air, which can then cool the cooling fluid in the recovery coil, and the evaporative fluid from the evaporative cooler is not collected for process cooling. In an example, the evaporative cooler can be configured to selectively operate in an adiabatic mode with a closed evaporative fluid cooling circuit. Various types of evaporative coolers usable in the conditioning systems of the present application are described below.

The pre-cooler can be configured to circulate a cooling fluid in order to condition the scavenger air prior to passing the scavenger air through the evaporative cooler. The inclusion of the pre-cooler can eliminate the need for supplemental mechanical cooling in some cooling applications. In an example, the cooling fluid circuit for the pre-cooler can be coupled with the cooling fluid circuit for the evaporative cooler and recovery coil (process cooling fluid), which is used to provide liquid or air cooling to the heat load. In another example, the cooling fluid circuit for the pre-cooler can be partially or wholly decoupled from the process cooling fluid circuit.

International Application No. PCT/CA2017/050180, published as WO 2017/152268, describes conditioning systems having these three components (pre-cooler, evaporative cooler, and recovery coil).

FIG. 1 illustrates a conditioning unit 10 that can be used to produce cold water for liquid cooling or air cooling of an enclosed space or a device. The conditioning unit 10 can operate in a blended mode between the adiabatic mode and the evaporative mode, as described below. In an example, the conditioning unit 10 can provide cooling to a data center. In an example, the conditioning unit 10 can be one of many units that make up a conditioning system to provide cooling to a heat load. In the application of data center cooling, for example, numerous units can make up the conditioning system to meet the heat load of the data center. The conditioning unit 10 can be in fluid connection with a hot water main and a cold water main, either or both of which can be dedicated to the conditioning unit or be in fluid connection with additional conditioning units. The cold-water main is indicated in FIG. 1 as cold water to data center (cold water 12) and the hot-water main is indicated in FIG. 1 as hot water from data center (hot water 14). In an example, large pipes (ring main) can be used to circulate the hot 14 and cold 12 water to and from the heat load.

The conditioning unit 10 can include one or more pre-coolers (PC) 16, one or more evaporative coolers (EC) 18, and one or more recovery coils (RC) 20. The one or more recovery coils 20 can also be referred to herein as dry coils or cooling coils. The one or more pre-coolers 16 can also be referred to herein as pre-cooling coils, pre-cooler coils, pre-conditioners or dry coils. The pre-coolers 16 can be referred to herein as first cooling components (upstream of the evaporative coolers 18) and the recovery coils 20 can be referred to herein as second cooling components (downstream of evaporative coolers 18).

The conditioning unit 10 can include a scavenger air plenum, indicated by a dotted line 22 in FIG. 1. The plenum 22 can include an air inlet 24 and an air outlet 26 through which a scavenger air stream can flow. The scavenger air plenum 22 can also be referred to as a housing, cabinet or structure and can be configured to house one or more components used to condition air or water. The plenum 22 can be disposed outside of an enclosed space having the heat load or located external to the devices that produce the heat load. The one or more pre-coolers 16, evaporative coolers 18 and recovery coils 20 can be arranged inside the plenum 22. In some examples, a filter (not shown) can be arranged inside the plenum 22 near the air inlet 24. In some examples, a fan or fan array (not shown) can be arranged inside the plenum 22 near the air outlet 26.

In the example conditioning unit 10 shown in FIG. 1, two pre-coolers 16 (PC-1, PC-2) are shown, three evaporative coolers 18 (EC-1, EC-2, EC-3) are shown, and two recovery coils 20 (RC-1, RC-2) are shown. It is recognized that more or less of each of the components (PC, EC, RC) can be included in the conditioning unit. As described above, the pre-cooler 16 can selectively operate depending on outdoor air conditions. In other example conditioning units, the pre-cooler 16 can be excluded.

As shown in FIG. 1, the conditioning unit 10 can include a tank 28 in fluid connection with a first pump 30 (P-1) and a second pump 32 (P-2). Water exiting the tank 28 can be delivered to the cold water main 12 via the first pump 30 (P-1). Water exiting the tank 28 can be delivered to the evaporative coolers 18 via the second pump 32 (P-2). The single tank 28 can be filled with water and thermal isolation can be created by managing the flow of warm and cold water into two pump suction bays, as described further below in reference to FIGS. 2-8. Cold water from the evaporative coolers 18 can be input into the tank. Warm or hot water from the recovery coils 20 can be input into the tank 28 through two different inlets, as represented by the two input arrows in FIG. 1 from the recovery coils 20 into the tank 28.

The tank 28 can be located inside or outside the plenum 22. The pumps 30, 32 can be located inside or outside the plenum 22. The tank 28 can include one or more sensors for sensing and monitoring various parameters inside the tank 28, such as, for example, water level, water temperature, etcetera. The design of the tank 28 can also include overflow features as well as a waste drain 34 and a recovery drain ring 36.

The scavenger air entering the plenum 22 can pass through the one or more pre-coolers 16 to precondition the scavenger air. The scavenger air exiting the one or more pre-coolers 16 can then pass through the one or more evaporative coolers 18. The evaporative cooler 18 can be configured to condition the scavenger air passing there through using an evaporative fluid, such as water. The evaporative cooler 18 can use the cooling potential in both the air and the evaporative fluid to reject heat. In an example, as scavenger air flows through the evaporative cooler 18, the evaporative fluid, or both the scavenger air and the evaporative fluid, can be cooled to a temperature approaching the wet bulb (WB) temperature of the air leaving the pre-cooler 16. Due to the evaporative cooling process in the evaporative cooler 18, a temperature of the evaporative fluid at an outlet of the evaporative cooler 18 can be less than a temperature of the evaporative fluid at an inlet of the evaporative cooler 18; and a temperature of the scavenger air at an outlet of the evaporative cooler 18 can be less than a temperature of the scavenger air at an inlet of the evaporative cooler 18. In some cases, a temperature reduction of the evaporative fluid can be significant, whereas in other cases, the temperature reduction can be minimal. Similarly, a temperature reduction of the scavenger air can range between minimal and significant. In some cases, the scavenger air temperature can increase across the evaporative cooler 18. Such temperature reduction of one or both of the evaporative fluid and the scavenger air can depend in part on the outdoor air conditions (temperature, humidity), operation of the pre-cooler 16, and operation of the evaporative cooler 18. In an example, the evaporative cooler 18 can selectively operate adiabatically, in which case a temperature of the evaporative fluid circulating through the evaporative cooler 18 can remain relatively constant or undergo minimal changes.

The evaporative cooler 18 can be any type of evaporative cooler configured to exchange energy between an air stream and a cooling fluid through evaporation of a portion of the fluid into the air. Evaporative coolers can include direct-contact evaporation devices in which the working air stream and the liquid water (or other fluid) stream that is evaporated into the air to drive heat transfer are in direct contact with one another. In what is sometimes referred to as "open" direct-contact evaporation devices, the liquid water may be sprayed or misted directly into the air stream, or, alternatively the water is sprayed onto a filler material or wetted media across which the air stream flows. As the unsaturated air is directly exposed to the liquid water, the water evaporates into the air, and, in some cases, the water is cooled.

Such direct-contact evaporation devices can also include what is sometimes referred to as a closed-circuit device. Unlike the open direct-contact evaporative device, the closed system has two separate fluid circuits. One is an external circuit in which water is recirculated on the outside of the second circuit, which is tube bundles (closed coils) connected to the process for the hot fluid being cooled and returned in a closed circuit. Air is drawn through the recirculating water cascading over the outside of the hot tubes, providing evaporative cooling similar to an open circuit. In operation the heat flows from the internal fluid circuit, through the tube walls of the coils, to the external circuit and then by heating of the air and evaporation of some of the water, to the atmosphere.

These different types of evaporative coolers can also be packaged and implemented in specific types of systems. For example, a cooling tower can include an evaporative cooling device such as those described above. A cooling tower is a device that processes working air and water streams in generally a vertical direction and that is designed to reject waste heat to the atmosphere through the cooling of a water stream to a lower temperature. Cooling towers can transport the air stream through the device either through a natural draft or using fans to induce the draft or exhaust of air into the atmosphere. Cooling towers include or incorporate a direct-contact evaporation device/components, as described above.

Examples of evaporative coolers usable in the conditioning systems of the present application can also include other types of evaporative cooling devices, including liquid-to-air membrane energy exchangers. Unlike direct-contact evaporation devices, a liquid-to-air membrane energy exchanger (LAMEE) separates the air stream and the liquid water stream by a permeable membrane, which allows water to evaporate on the liquid water stream side of the membrane and water vapor molecules to permeate through the membrane into the air stream. The water vapor molecules permeated through the membrane saturate the air stream and the associated energy caused by the evaporation is transferred between the liquid water stream and the air stream by the membrane.

Some or all of the one or more evaporative coolers 18 can include a LAMEE as the evaporative cooler. The LAMEE can also be referred to herein as an exchanger or an evaporative cooler LAMEE. A liquid to air membrane energy exchanger (LAMEE) can be used as part of a heating and cooling system (or energy exchange system) to transfer heat and moisture between a liquid desiccant and an air stream to condition the temperature and humidity of the air flowing through the LAMFE. The membrane in the LAMEE can be a non-porous film having selective permeability for water, but not for other constituents that form the liquid desiccant.

Many different types of liquid desiccants can be used in combination with the non-porous membrane, including, for example, glycols. The non-porous membrane can make it feasible to use desiccants, such as glycols, that had been previously determined to be unacceptable or undesirable in these types of applications. In an example, the membrane in the LAMEE can be semi-permeable or vapor permeable, and generally anything in a gas phase can pass through the membrane and generally anything in a liquid phase cannot pass through the membrane. In an example, the membrane in the LAMEE can be micro-porous such that one or more gases can pass through the membrane. In an example, the membrane can be a selectively-permeable membrane such that some constituents, but not others, can pass through the membrane. It is recognized that the LAMEEs included in the conditioning units disclosed herein can use any type of membrane suitable for use with an evaporative cooler LAMEE.

In an example, the LAMEE or exchanger can use a flexible polymer membrane, which is vapor permeable, to separate air and water. The water flow rate through the LAMEE may not be limited by concerns of carryover of water droplets in the air stream, compared to other conditioning systems. The LAMEE can operate with water entering the LAMEE at high temperatures and high flow rates, and can therefore be used to reject large amounts of heat from the water flow using latent heat release (evaporation).

The cooling fluid circulating through the LAMEE or exchanger can include water, liquid desiccant, glycol, other hygroscopic fluids, other evaporative liquids, and/or combinations thereof. In an example, the cooling fluid is a liquid desiccant that is a low concentration salt solution. The presence of salt can sanitize the cooling fluid to prevent microbial growth. In addition, the desiccant salt can affect the vapor pressure of the solution and allow the cooling fluid to either release or absorb moisture from the air. The concentration of the liquid desiccant can be adjusted for control purposes to control the amount of cooling of the scavenger air or cooling fluid within the LAMEE or exchanger.

Membrane exchangers may have some advantages over other types of evaporative coolers. For example, the LAMEE may eliminate or mitigate maintenance requirements and concerns of conventional cooling towers or other systems including direct-contact evaporation devices, where the water is in direct contact with the air stream that is saturated by the evaporated water. For example, the membrane barriers of the LAMEE inhibit or prohibit the transfer of contaminants and micro-organisms between the air and the liquid stream, as well as inhibiting or prohibiting the transfer of solids between the water and air. The use of LAMEEs along with an upstream or downstream cooling coil can result in a lower temperature of the water leaving the LAMEE and a higher cooling potential. Various configurations of cooling systems having a LAMFE can boost performance in many climates. Higher cooling potential and performance can result in lower air flow and fan power consumption in the cooling system, which is the main source of energy consumption in liquid-cooling systems. In an example in which the heat load is from a data center, this can increase the overall data center cooling system efficiency.

Depending upon the application and a number of factors, the evaporative cooler 18 can include any type of evaporative cooler configured to exchange energy between an air stream and a cooling fluid through evaporation of a portion of the fluid into the air.

In an example, the evaporative fluid from the evaporative cooler 18 can be collected and delivered to the tank 28 and thus can be used to provide cooling for the heat load. In other examples described herein, the evaporative fluid from the evaporative cooler 18 is not collected for cooling the heat load. In yet other examples, the conditioning system 10 can be configured to switch between a configuration in which the evaporative fluid exiting the evaporative cooler 18 is collected and transported to the tank 28 and operating the evaporative cooler 18 adiabatically to circulate the evaporative fluid through the evaporative cooler 18 only.

In an example, the evaporative fluid in the evaporative cooler 18 can be water or predominantly water. It is recognized that other types of evaporative cooling fluids can be used in combination with water or as an alternative to water in the conditioning systems described herein.

The dry coil or recovery coil 20 can be arranged inside the plenum 22 downstream of the evaporative cooler 18. The recovery coil 20 can cool a cooling fluid circulating through the recovery coil 20 using the cooling potential of the scavenger air. The scavenger air exiting the evaporative cooler 18 can be relatively cool and additional sensible heat from the cooling fluid passing through the recovery coil 20 can be rejected into the scavenger air. The recovery coil 20 can produce a reduced-temperature cooling fluid that can provide cooling to the heat load. The reduced-temperature cooling fluid exiting the recovery coil 20 can flow to the evaporative cooler 18 or the tank 28. The scavenger air exiting the recovery coil 20 can be directed out of the plenum 22 using one or more fans. The scavenger air can exit the plenum 22 as exhaust.

In an example, the cooling fluid circulating through the recovery coil 20 can be water. In an example, the cooling fluid circulating through the recovery coil 20 can be the same fluid as the evaporative fluid in the evaporative cooler 18.

As provided above, in an example, the evaporative fluid in the evaporative cooler 18 can be water. In an example, the reduced-temperature water from the outlet of the evaporative cooler 18 can be used to provide cooling to the heat load. The reduced-temperature water can flow from the evaporative cooler 18 to the tank 28.

The water from the tank 28 can provide cooling to the heat load by transporting the water to the heat load. The reduced-temperature water can provide cooling to the heat load using any known methods to reject heat from air or one or more devices, and such methods can include, but are not limited to, liquid immersing technology, cold plate technology, rear door heat exchangers, cooling distribution units (CDU), and cooling coils. In an example, the water can directly cool one or more components producing the heat load. The one or more components can include, but are not limited to, electrical components. In an example in which the heat load comes from an enclosed space, the water can pass through one or more cooling coils placed in a path of the supply air in the enclosed space, and the water in the cooling coils can sensibly cool the supply air.

After the water provides cooling to the heat load, the water can be recirculated back through the unit 10. The water can be at an increased-temperature after providing cooling to the heat load because the rejected heat from the heat load has been picked up by the water. The increased-temperature water can be transported to the recovery coil 20. The dry coil or recovery coil 20 can cool the water using the scavenger air exiting the evaporative cooler 18. At least a portion of the reduced temperature water can be sent to the tank 28, depending on an operating mode of the unit 10. In some instances, a portion of the reduced temperature water can be sent to the evaporative cooler 18.

In an economizer mode, all of the water from the recovery coil 20 can bypass the evaporative cooler 18 and go directly to the tank 28. The economizer mode or winter mode can enable the conditioning unit 10 to cool the water using the scavenger air and recovery coil 20, without having to run the evaporative cooler 18. In that situation, there may be no need for evaporation inside the evaporative cooler 18 since the cold outdoor air (scavenger air) can pass through the evaporative cooler 18 and sufficiently cool the water. The recovery coil 20 can also be referred to herein as an economizer coil since it can be a primary cooling source for the water in the economizer mode. Three modes of operation are described further below for operating the conditioning unit 10.

The one or more pre-coolers 16, located upstream of the evaporative cooler 18, can be used to pre-condition the scavenger air entering the plenum 22, prior to passing the scavenger air through the evaporative cooler 18. The pre-cooler 16 can be effective when the temperature of the water entering the pre-cooler 16 is lower than the outdoor air dry bulb temperature. The pre-cooler 16 can be used in typical summer conditions as well as in extreme summer conditions when the outdoor air is hot and humid. The pre-cooler 16 can depress the outdoor air wet bulb temperature, thus pre-cooling the scavenger air and heating the water. The pre-cooler 16 can provide more cooling potential in the evaporative cooler 18.

In an example, the pre-cooler 16 can use water from the tank 28 to condition the scavenger air. Because the pre-cooler 16 uses water from the tank 28 as the cooling fluid in the pre-cooler 16, the design of the pre-cooler 16 can be referred to as a coupled pre-cooler. In other words, the pre-cooler 16 is designed and configured to use a portion of the reduced-temperature water produced by the recovery coil 20 or the evaporative cooler 18 (and intended for cooling the heat load) as the cooling fluid for the pre-cooler 16. In other examples, a cooling fluid circuit for the pre-cooler 16 can be partially or wholly decoupled from the process circuit for the evaporative cooler 18 and recovery coil 20. In that case, the pre-cooler 16 can have an external cooling circuit partially or wholly separate from the reduced-temperature water produced by the evaporative cooler 18 or recovery coil 20 for process cooling.

The plenum 22 can include one or more sets of bypass dampers—for example, a first set of dampers can be located between the pre-cooler 16 and the evaporative cooler 18, and a second set of dampers can be located between the evaporative cooler 18 and the recovery coil 20. The use of the bypass dampers can direct the flow of scavenger air into the plenum 22 depending on the outdoor air conditions.

The conditioning unit 10 can operate in at least three modes and selection of the mode can depend, in part, on the outdoor air conditions and the heat load. When the outdoor air is cold, the conditioning unit can operate in a first mode, an economizer mode, and the pre-cooler 16 and the evaporative cooler 18 can be bypassed. The scavenger air can enter the plenum 22 downstream of the evaporative cooler 18 and pass through the recovery coil 20. This can protect the evaporative cooler 18 and avoid running the evaporative cooler 18 when it is not needed. In the first mode or economizer mode, the scavenger air can be cool enough such that the recovery coil 20 can provide all cooling to the water delivered to the tank 28 sufficient to provide cooling to the heat load, without needing to operate the evaporative cooler 18.

In a second operating mode, which can also be referred to as a normal mode or an evaporation mode, the pre-cooler 16 can be bypassed but the evaporative cooler 18 can be used. The evaporation mode can operate during mild conditions, such as spring or fall, when the temperature or humidity is moderate, as well as during some summer conditions. The scavenger air may be able to bypass the pre-cooler 16, while still meeting the cooling load. The scavenger air can enter the plenum 22 downstream of the pre-cooler 16 and pass through the evaporative cooler 18 and the recovery coil 20. In an example, the dampers can be excluded or may not be used in some cases. In such example, during the second operating mode, the scavenger air can pass through the pre-cooler 16 but the pre-cooler 16 can be turned off such that the water or cooling fluid is not circulating through the pre-cooler 16.

In a third operating mode, which can also be referred to as an enhanced mode or a super-evaporation mode, the conditioning unit 10 can run using both the pre-cooler 16 and the recovery coil 20. Under extreme conditions, or when the outdoor air is hot or humid, the unit 10 can provide pre-cooling to the scavenger air, using the pre-cooler 16, before the scavenger air enters the evaporative cooler 18. The pre-cooler 16 can be used to improve the cooling power of the unit 10, allowing the evaporative cooler 18 to achieve lower discharge temperatures. The pre-cooler 16 can reduce or eliminate a need for supplemental mechanical cooling. In an example, a portion of the water exiting the pre-cooler 16 can be directed to the evaporative cooler 18. In other examples, the cooling fluid circuit of the pre-cooler 16 can be decoupled from the evaporative cooler 18.

The conditioning system 10 can include a system controller 38 to control operation of the conditioning system 10 and control an amount of cooling provided from the cooling system 10 to the heat load (via the cold water 12). The system controller 38 can be manual or automated, or a combination of both. The conditioning system 10 can be operated so that a temperature of the water in the tank 28 can be equal to a set point temperature that can be constant or variable. In an example, instead of measuring/monitoring a temperature of the water in the tank, a temperature of the water after the water exits the tank (via the second pump 32) can be measured and compared to the set point temperature. The set point temperature can be determined based in part on the cooling requirements of the heat load. In an example, the set point temperature can vary during operation of the conditioning unit 10, based in part on operation of the data center or other devices that produce the heat load.

The system controller 38 can include hardware, software, and combinations thereof to implement the functions attributed to the controller herein.

The system controller 38 can be an analog, digital, or combination analog and digital controller including a number of components. As examples, the controller 38 can include ICB(s), PCB(s), processor(s), data storage devices, switches, relays, etcetera. Examples of processors can include any one or more of a microprocessor, a controller, a digital signal processor (DSP), an application specific integrated circuit (ASIC), a field-programmable gate array (FPGA), or equivalent discrete or integrated logic circuitry. Storage devices, in some examples, are described as a computer-readable storage medium. In some examples, storage devices include a temporary memory, meaning that a primary purpose of one or more storage devices is not long-term storage. Storage devices are, in some examples, described as a volatile memory, meaning that storage devices do not maintain stored contents when the computer is turned off. Examples of volatile memories include random access memories (RAM), dynamic random access memories (DRAM), static random access memories (SRAM), and other forms of volatile memories known in the art. The data storage devices can be used to store program instructions for execution by processor(s) of the controller 38. The storage devices, for example, are used by software, applications, algorithms, as examples, running on and/or executed by the controller 38. The storage devices can include short-term and/or long-term memory, and can be volatile and/or non-volatile. Examples of non-volatile storage elements include magnetic hard discs, optical discs, floppy discs, flash memories, or forms of electrically programmable memories (EPROM) or electrically erasable and programmable (EEPROM) memories.

The system controller 38 can be configured to communicate with the conditioning system 10 and components thereof via various wired or wireless communications technologies and components using various public and/or proprietary standards and/or protocols. For example, a power and/or communications network of some kind may be employed to facilitate communication and control between the controller 38 and the conditioning system 10. In one example, the system controller 38 can communicate with the conditioning system 10 via a private or public local area network (LAN), which can include wired and/or wireless elements functioning in accordance with one or more standards and/or via one or more transport mediums. In one example, the system 10 can be configured to use wireless communications according to one of the 802.11 or Bluetooth specification sets, or another standard or proprietary wireless communication protocol. Data transmitted to and from components of the conditioning unit 10, including the controller 38, can be formatted in accordance with a variety of different communications protocols. For example, all or a portion of the communications can be via a packet-based, Internet Protocol (IP) network that communicates data in Transmission Control Protocol/Internet Protocol (TCP/IP) packets, over, for example, Category 5, Ethernet cables.

The system controller 38 can include one or more programs, circuits, algorithms or other mechanisms for controlling the operation of the conditioning system 10. For example, the system controller 38 can be configured to modulate the speed of one or more fans in the plenum 22 and/or control actuation of one or more valves to direct cooling fluid from the outlet of one or more components of the unit 10 to the tank 28. The system controller 38 can also be configured to operate the system 10 in the modes described herein.

Figure 2:
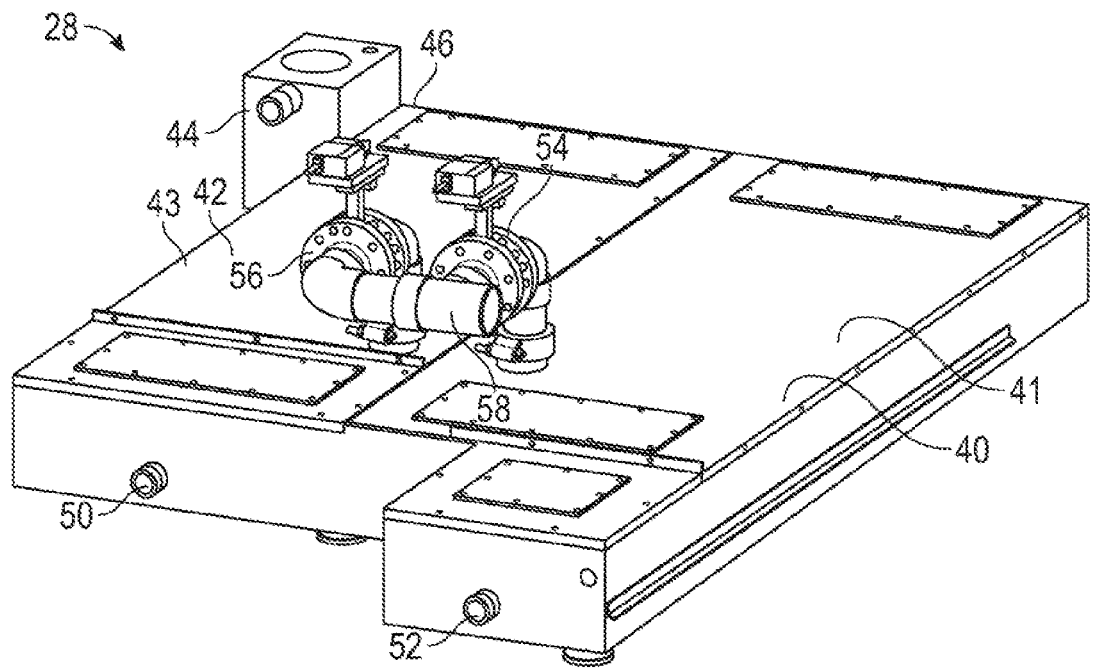
FIG. 2 is a perspective view of an example tank for use in the conditioning unit of FIG. 1.
Figure 3:
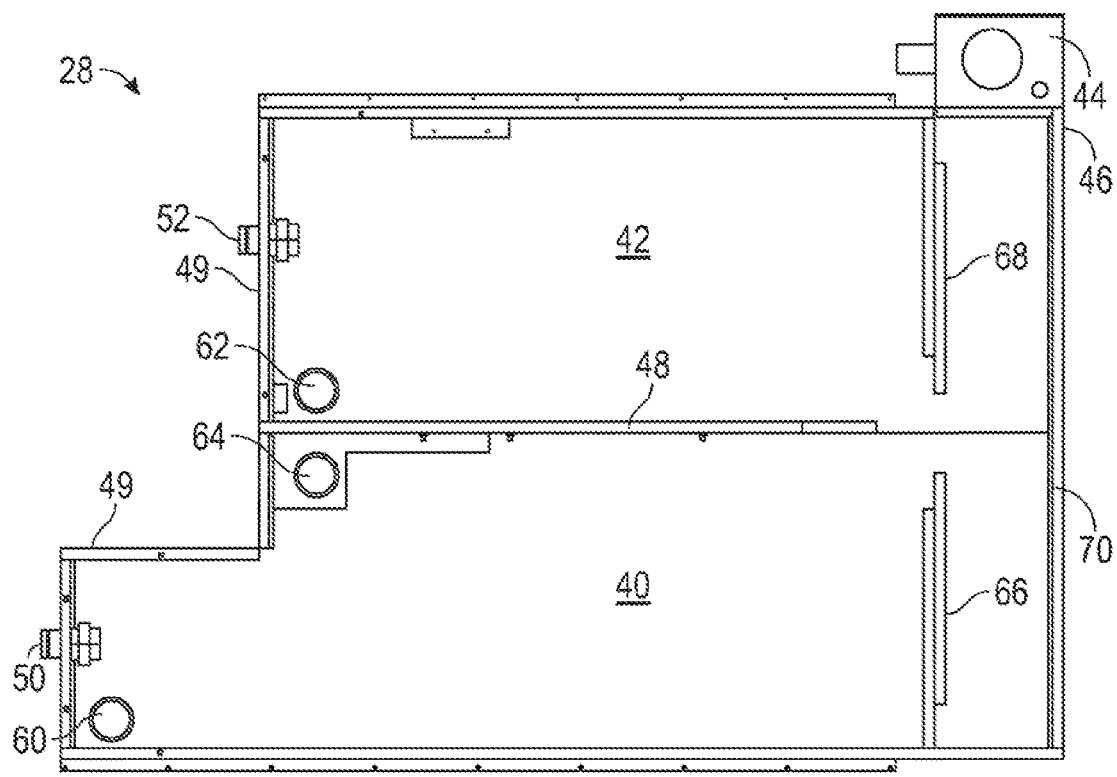
FIG. 3 is a top view of the tank of FIG. 2.

FIG. 2 shows an example of the design of the tank 28 of FIG. 1. The tank 28 can include a first pump suction bay 40, having a first cover 41, and a second pump suction bay 42, having a second cover 43. FIG. 3 shows a top view of the tank 28 of FIG. 2 with the covers 41, 43 removed to show interior features of the tank 28. The water exiting the evaporative cooler can enter the tank 28 through a discharge break tank 44 at a back end 46 of the tank 28 and the water can be generally free to flow into either of the pump bays 40, 42. Such water from the evaporative cooler can be referred to herein as cold discharge water or EC discharge water. The back end 46 of the tank can also be referred to herein as a discharge area since such area of the tank 28 receives the discharge water from the evaporative cooler. The break tank 44 can be used for back pressure control and energy dissipation. The tank 28 can include a dividing baffle 48 for separation of the first and second pump bays 40, 42. A front end 49 of the tank 28 can include a first pump suction inlet 50 for the first pump suction bay 40 and a second pump suction inlet 52 for the second pump suction bay 42.

The tank 28 is configured such that each pump suction bay 40, 42 can receive return water from the recovery coil and the amount of return water delivered to each suction bay 40, 42 can be varied via a corresponding valve 54, 56, respectively. FIG. 2 shows a portion of piping 58 from the recovery coil. Although such return water from the recovery coil has been circulated through the recovery coil before being delivered to the tank 28, such return water can still be relatively warm or hot in some cases (depending on outdoor air conditions), and thus is referred to herein as hot return water or RC return water. It is recognized that under some outdoor air conditions such return water can be cool or relatively cold. Such return water is also referred to herein as RC discharge water. The distribution or ratio of hot return water delivered to each pump suction bay 40, 42 can be regulated as described below. The design shown in FIG. 2 includes two modulating two-way valves 54 and 56. Ire other designs, a three-way valve (see FIG. 8) can be used to control the distribution of return water to the two suction bays 40, 42.

Each of the bays 40, 42 can include a recovery drain 60, 62, respectively. An overflow drain/weir 64 can be included at the front end 49 of the tank 28 in the second pump suction bay 42.

The first pump suction inlet 50 can be used to transfer water out of the first bay 40 and to the first pump 30 such that water can be pumped to the cold water main 12 to provide cooling to the data center or other heat load. The second pump suction inlet 52 can be used to transfer water out of the second bay 42 and to the second pump 32 such that water can be recirculated back to the evaporative coolers 18.

When the conditioning unit 10 is operating, essentially all of the tank 28 can be full of water, provided that some air space is needed in the tank 28 to facilitate level control and fluctuations in the tank 28. Thermal isolation can be accomplished in the tank 28, at least in part, by controlling the delivery of the hot return water from the recovery coil 20 into the two suction bays 40, 42 and managing the flow currents in the tank 28 to prevent convective mixing. As shown in FIG. 3, the dividing baffle 48 is used to physically separate at least a portion of the suction bays 40, 42 from one another. It is recognized that the dividing baffle 48 can be excluded from the tank 28 and other designs/features can be used as an alternative or in addition to the baffle 48 to thermally isolate the two suction bays 40, 42.

The tank 28 can include a diverter 66, 68 in each of the bays 40, 42, respectively. The EC discharge water can enter the tank 28 through the break tank 44 and flow into the space between the diverters 66, 68 and a back wall 70 of the tank 28. An opening exists between the diverters 66, 68 and between an end of the baffle 48 and the diverters 66, 68. These openings allow the cold water entering the tank 28 to flow into the bays 40, 42. Such openings can be fixed or variable. For example, the baffle 48 can include a sliding plate such that the distance between the end of the baffle 48 and the diverters 66, 68 can be changed.

For the hot return water (from the recovery coil) entering the suction bays 40, 42 through valves 54, 56 such hot return water can be added into suction bays 40, 42 using different fluid designs and features to manage how the hot return water is introduced into the suction bays 40, 42. Examples of such designs/features are described below in reference to FIGS. 4-7.

Figure 4:
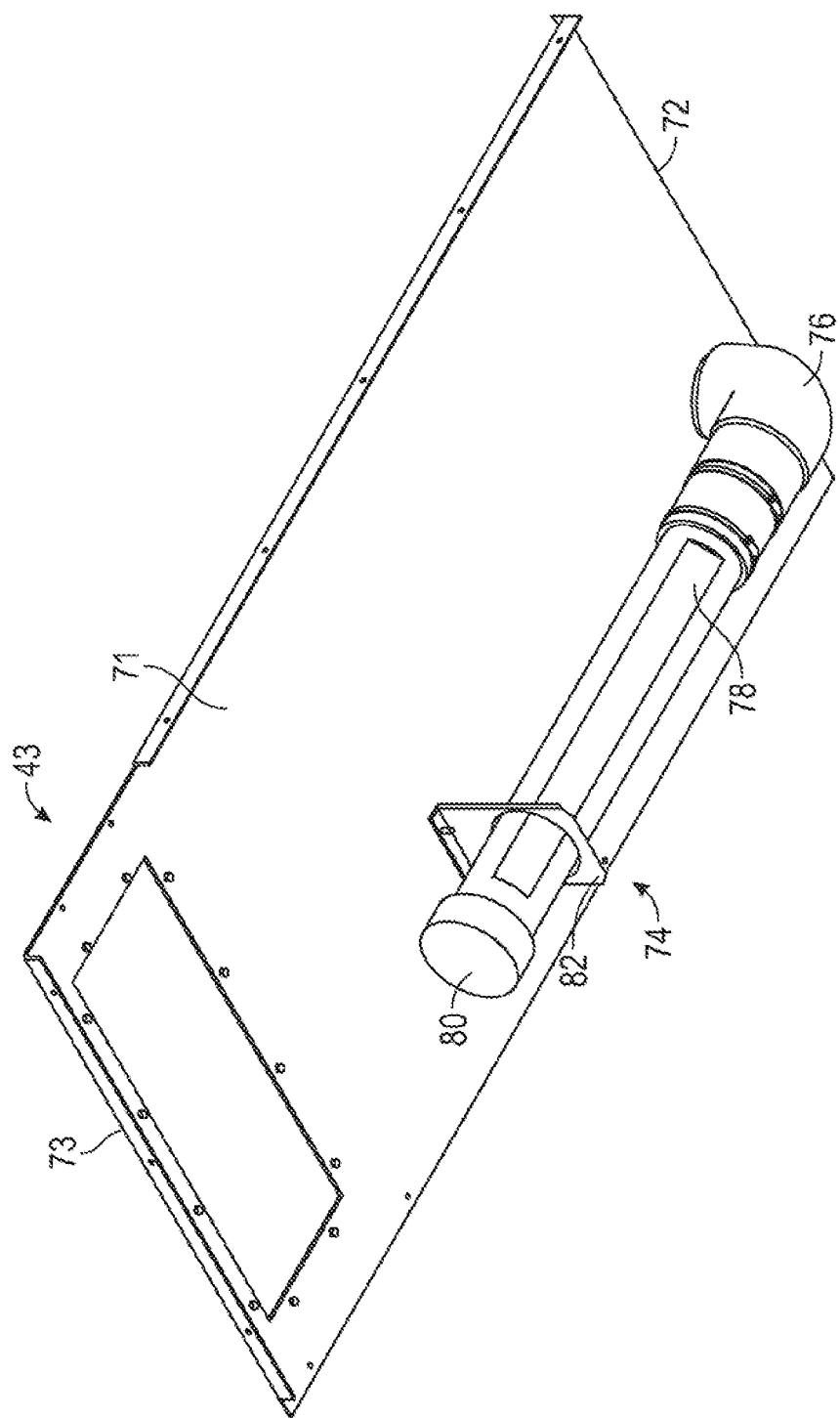
FIG. 4 is a perspective view of a portion of the tank of FIG. 2.

FIG. 4 shows an underside 71 of the cover 43 for the second pump suction bay 42. The cover 43 can have a front end 72 that is aligned with the front end 49 of the 28 tank (when the cover 43 is on the tank 28) and a back end 73 that is aligned with the back end 46 of the tank 28 (when the cover 43 is on the tank 28). FIG. 4 also shows a discharge pipe 74, The discharge pipe 74 can be connected to the valve 56 and piping 58 shown in FIG. 2 such that hot return water from the recovery coil can flow through the piping 58 and into the discharge pipe 74. The discharge pipe 74 can deliver the hot return water into the second pump suction bay 42. The discharge pipe 74 can include an elbow 76, tubing 78, and cap 80. In an example, a hanger 82 can be used to attach the tubing 78 to the underside 71 of the cover 43.

Figure 5:
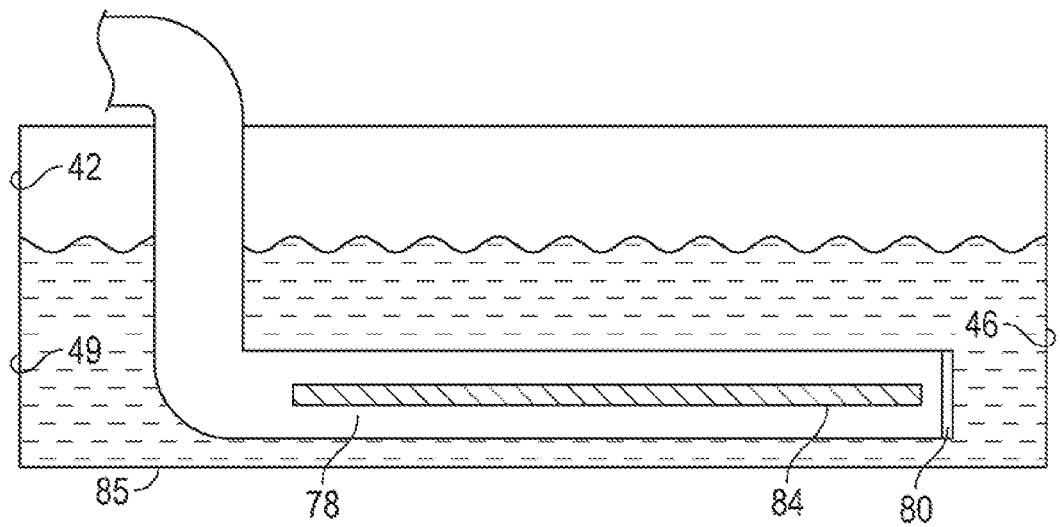
FIG. 5 is a simplified schematic showing a side view of a discharge tube of the tank.
Figure 6:
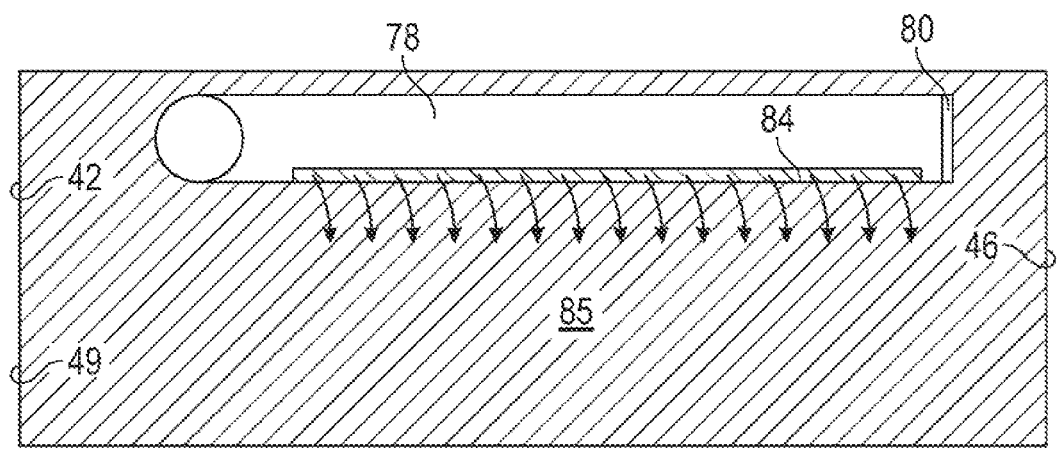
FIG. 6 is a simplified schematic showing a top view of the discharge tube of the tank.

In an example, the tubing 78 can include a diffuser slot 84 formed in the tubing 78 for releasing/delivering the hot return water from the discharge pipe 74 and into the pump suction bay 42. FIGS. 5 and 6 show a simplified schematic of the pump suction bay 42 and the discharge pipe 74 to illustrate the diffuser slot 84. FIG. 5 is a side view of the discharge pipe 74 and FIG. 6 is a top view of the discharge pipe 74. In the example shown in FIGS. 5 and 6, the diffuser slot 84 can be formed in a side of the discharge pipe 74 at an angle of approximately 45 degrees, relative to a bottom surface 85 of the tank 28. As such, the water exiting the pipe 74 through the slot 84 hits the bottom 85 of the tank 28 at an angle. In another example, the tubing 78 can be oriented such that the slot 84 faces the bottom 85 of the tank 28. It is recognized that various positions of the slot 84 can be used to direct the water exiting the pipe 74 in a particular direction.

It is recognized that other angles and configurations of the diffuser slot 84 can be used for the discharge pipe 74. The discharge pipe 74 is designed to control an orientation and/or direction at which the water is introduced into the bay 42. It can be important to direct the hot return water toward the pump inlet 52. It can be important to control, and in some cases, minimize a velocity at which the hot return water is introduced into the bay 42, to minimize turbulence inside the bay 42. For example, if the slot 84 points toward the bottom of tank 28, turbulence of the water at or near the surface of the water in the tank 28 can be minimized or prevented.

As shown in FIGS. 5 and 6, the slot 84 is an elongated slot formed in the tubing 78. In an example, a majority of the total length of the tubing 78 includes the slot 84. It is recognized that a length and width of the slot 84 can be determined based in part on a target velocity of the water exiting through the slot 84. Although not specifically shown, the first pump suction bay 40 can include a similar discharge pipe to the discharge pipe 74 shown in FIG. 4.

Figure 7:
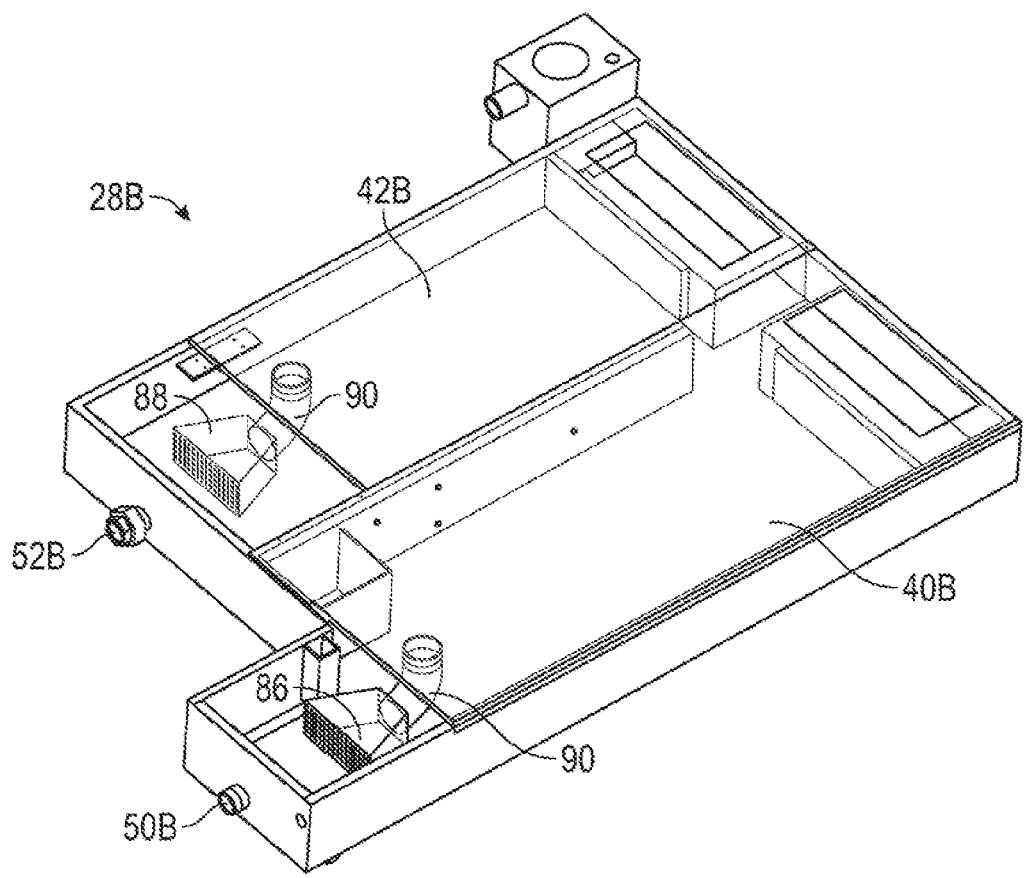
FIG. 7 is a perspective view of an example tank for use in the conditioning unit of FIG. 1.

FIG. 7 illustrates another example of a tank 28B that can be used in the conditioning system 10. FIG. 7 is an alternative design for introducing the hot return water from the recovery coil into first and second pump suction bays 40B. 42B. The tank 28B can be generally similar to the tank 28 described above and shown in FIGS. 2-6. The tank 28B can include the same general design and features with the exception that instead of the discharge pipe 74 shown in FIGS. 4-6, the tank 28B can include a first diffuser 86 in the first pump suction bay 40B and a second diffuser 88 in the second pump suction bay 42B. The first and second diffusers 86, 88, in combination with an elbow 90 connected to each of the diffusers 86, 88, are designed to slow down the fluid flow or reduce the velocity of the water as it is released into the respective bay 40B and 42B, and to direct the water to pump suction inlets 50B and 52B. A particular location for the diffusers 86, 88 within the respective bay 40B, 42B can vary depending in part on a target velocity of the water existing the diffuser 86, 88 and a desired distance of the diffusers 86, 88 from the respective pump suction inlet 50B, 52B.

Additional features can be used in addition to or as an alternative to those included in the design of the tank 28, 28B in FIGS. 2-7 to control the distribution and flow of water in the tank 28, 28B and through the first and second pumps 30, 32 (P-1, P-2).

Figure 8:
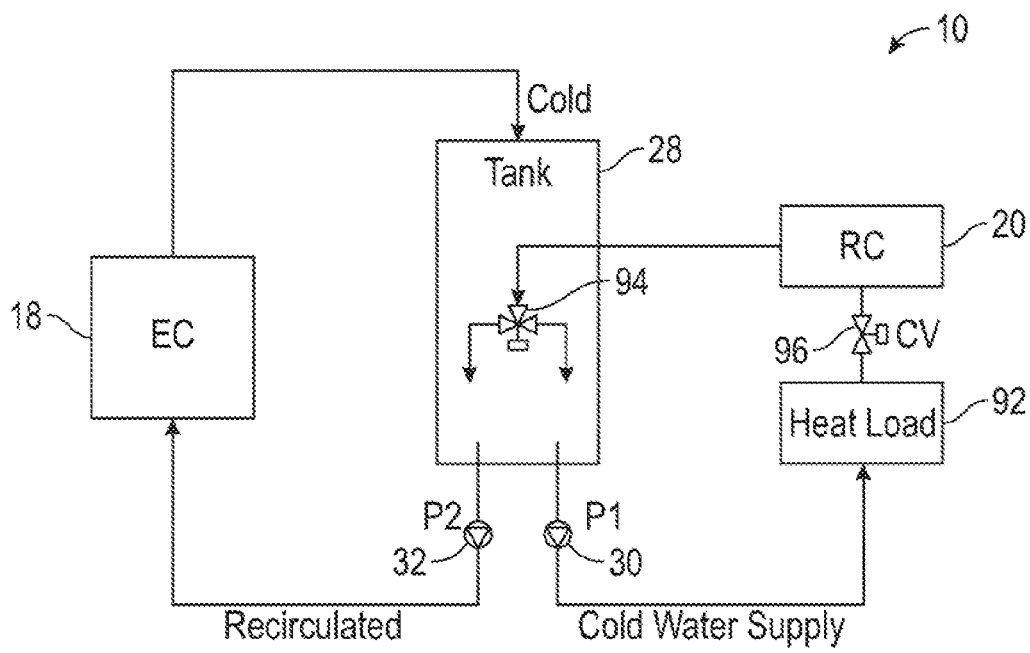
FIG. 8 is a simplified schematic of the conditioning unit of FIG. 1.

FIG. 8 is a simplified schematic of the conditioning unit 10 including the tank 28 and the fluid flow paths into and out of the tank 28. FIG. 8 also schematically shows the evaporative cooler (EC) 18, recovery coil (RC) 20 and heat load 92, relative to the various flow paths. The distribution of the hot return water from the RC 20 to the first and second pump suction bays can depend on an operating mode of the conditioning system 10. For simplicity, FIG. 8 does not show the structural components of the tank 28, including the first and second pump suction bays. Thus, for the description below of operating in the various modes, reference is made to the other figures included herein and described above. FIG. 8 can be applicable to various designs of the tank 28, including the example shown in FIGS. 4-6 or the example shown in FIG. 7.

FIG. 8 shows a three-way valve 94 for modulating a flow from the RC 20 to the first and second pump suction bays of the tank 28. The three-way valve 94 can be used in place of the two-way valves 54, 56 shown in FIG. 2.

In the economizer mode, one or both of the valves 54, 56 (or one or both sides of the valve 94) can be open such that the return water from the recovery coil 20 can flow through the valves 54, 56 (or both sides of the valve 94) into either suction bay 40, 42 of the tank 28. The economizer mode operates in conditions in which the outdoor air can sufficiently cool the hot water from the heat load 92. Thus the temperature of the return water from the recovery coil 20 in the economizer mode is not warm or hot in the outdoor air conditions under which the economizer mode is used. After the water from the recovery coil 20 flows into the tank 28, all supply water can be pumped by the first pump 30 (P-1) to the cold water main 12. In the economizer mode, the second pump 32 (P-2) can be off since the evaporative cooler 18 is not used in that operating mode. The tank level can be sensed by a tank level sensor and controlled in part by an RC-fill valve 96 (or control valve, CV).

In the adiabatic mode, the water from the recovery coil 20 can flow only through the valve 54 into the first suction bay 40. In contrast to the economizer mode, the second pump 32 (P-2) can be on in the adiabatic mode and the second pump 32 (P-2) can pump a recirculating flow of water through the evaporative cooler 18 and back into the tank 28 via the break tank 44. The rear or back 46 of the tank 28 can be flooded with cold water. Generally all or close to all of the cold water from the EC 16 can naturally flow into the second pump suction bay 42 since the first pump suction bay 40 can be supplied with water from the recovery coil 20. Under the single tank design, the adiabatic mode is not a completely closed fluid circuit; however, the control of the flow of water in the tank 28 as described immediately above can generally separate the EC discharge water from the recovery coil return water.

In the evaporative mode, all water from the recovery coil 20 can be diverted through the valve 56 into the second pump suction bay 42. Because the second pump suction bay 42 is filled with hot water, the cold discharge water from the evaporative cooler 16 can naturally flow into the first pump suction bay 40. The flow of cold water into the first pump suction bay 40 can be in proportion to a pumping rate of the first pump 30 (P-1), with any remaining water flowing back to the second pump suction bay 42. To ensure that all the RC return water flows to the second pump inlet 52, a flow rate of the second pump 32 (P-2) should be greater than a flow rate of the first pump 30 (P-1). An overall tank level can be controlled by the RC-fill valve 96.

The blended mode operation can involve varying the distribution of hot return water from the recovery coil 20 into the two pump suction bays 40, 42 and corresponding pump suction inlets 50, 52, and consequently varying the mix ratio of warm and cold water into the pumped cold water supply (to the heat load 92) via the pump 30 and into the pumped recirculated water (to the evaporative cooler 16) via the pump 32. The valves 54, 56 (or the 3-way valve 94) can control the proportion of hot return water going into the suction inlets 50, 52 for the pumps 30, 32, respectively (P-1, P-2).

The conditioning unit 10 can be controlled to maintain a supply water temperature set point under varying ambient air conditions or varying cooling loads. The conditioning unit 10 accomplishes this by varying the mix ratio of EC discharge water and RC return water into the pump suction bays 40, 42. For example, if the conditioning unit 10 enters the wet mode of operation in the equivalent of the adiabatic mode (100% of RC return water into the first pump suction 40 and 100% evaporative cooler discharge into the second pump suction 42) and the ambient outdoor air conditions rise (increased temperature or humidity), the supply water temperature delivered by the first pump 30 (P-1) may rise above the set point. In this case, the controller 38 of the unit 10 can begin to modulate the RC return valves 54, 56 to divert a portion of the return water into the second pump suction bay 42, which can cause an equivalent portion of cold EC discharge water to flow into the first pump suction bay 40, lowering the supply water temperature to the set point.

The mix ratio can be continuously modulated by the controller 38 to maintain supply water temperature set point in response to varying ambient conditions and load. At peak ambient conditions or peak cooling loads the conditioning unit 10 may operate in the equivalent of the evaporative mode (100% of RC return water into P-2 suction, and P-1 suction being supplied essentially all by EC discharge water).

If a pre-cooler 16 is included in the conditioning unit 10 the pre-cooler 16 can selectively be used in any of the adiabatic mode, evaporative mode, or blended mode. When the pre-cooler 16 is used in the evaporative mode, the operating mode can be referred to as an enhanced or super-evaporation mode. The pre-cooler 16 can precondition the outdoor air and can be effective particularly in hot or humid conditions.

The modulation of the water mix ratio can be used to control the supply water temperature and evaporation rate in the evaporative cooler 18. Because capacity modulation can be accomplished by varying water mix ratio, airflow modulation may not be needed in the evaporative (wet) mode of operation. When the conditioning unit transitions from the economizer mode to the wet mode, the air flow rate (fan speed) can be held constant, and the supply water temperature can be controlled by the mix ratio. The conditioning unit 10 can be optimized for power or water efficiency by changing the fan speed setting in the wet mode. The highest water efficiency occurs when the fan speed is maximized, and the highest power efficiency occurs when the fan speed is minimized.

The mixing of the EC discharge water (entering the break tank 44) and the RC discharge water (entering into one or both of the suction bays 40, 42) can be varied in order for the water at the first suction pump inlet 50 to be at or near the setpoint temperature. As the outdoor air conditions change, the temperature of the EC discharge water changes. Similarly, the temperature of the RC discharge water changes as a function of the outdoor air conditions. Thus the mix ratio of the two water sources (EC discharge water and RC discharge water) provided to the first pump suction inlet 50 is changing to achieve the temperature for the cold water supply from the first pump 30.

At peak cooling, the unit 10 can be controlled to minimize any warm water (RC discharge water) going into the first pump suction inlet 50 for delivery by the first pump 30. If the flow rate of the second pump 32 is high or increased, the hot/warm water can be drawn into the second pump 32 and any cold water can flow to the back 46 of the tank 28 at which point it can be available to be withdrawn from the tank 28 by the first pump 30.

The system controller 38 can make various adjustments in order to maintain the supply water temperature (from the first pump 30) at or near the setpoint temperature, based on the demands of the heat load 92 and outdoor air conditions. In an example, the water mix ratio can be adjusted in discrete steps (for example, 10%, 20%, 30%, etc.), and the precise control of the supply water temperature can be done by air flow modulation (for example, via one or more fans). In another example, the air flow rate can be fixed and the water mix ratio can be precisely modulated such that the supply water temperature stays at or near the set point temperature. It is recognized that additional parameters can be controlled to maintain the supply water temperature at or near the setpoint temperature. Another possible control parameter can include, for example, varying the flow rate through the evaporative cooler.

Figure 9:
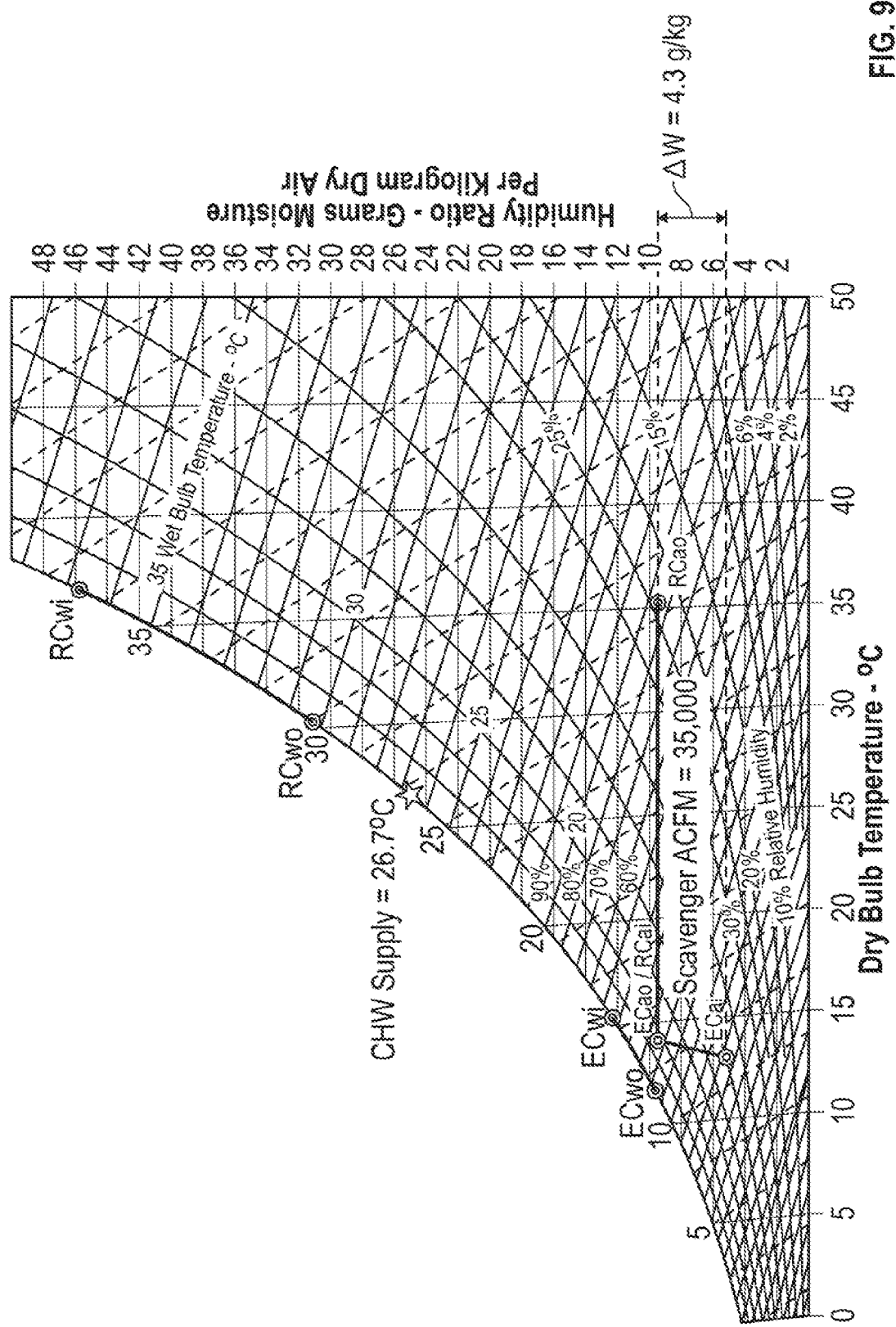
FIG. 9 is a psychometric chart of a conditioning unit operating in an adiabatic mode.
Figure 10:
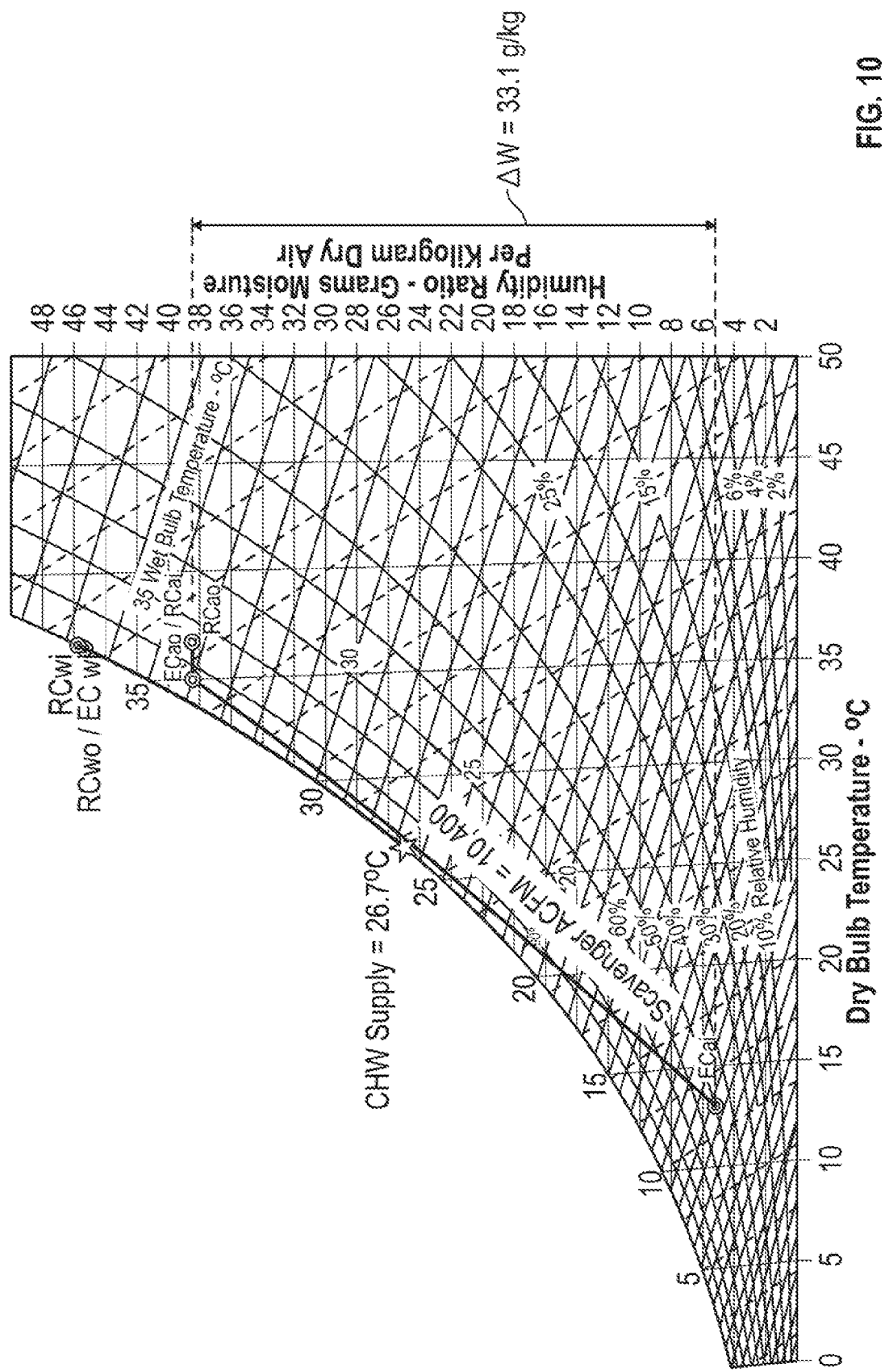
FIG. 10 is a psychometric chart of the conditioning unit of FIG. 9 operating under the same outdoor air conditions but in an evaporation mode.

FIGS. 9 and 10 are psychometric charts for conditionings units operating without the blended mode and under the same outdoor air conditions. FIG. 9 shows the conditioning unit operating under the adiabatic mode for a particular set of outdoor or ambient air conditions. FIG. 10 shows the same conditioning unit operating under the evaporative mode under that same set of outdoor or ambient air conditions. Under both modes, the conditioning unit is able to provide sufficient cooling such that the cold water supply to the heat load is at or near the set point temperature of 26.7 degrees Celsius. The evaporative cooler (EC) in the conditioning unit of FIGS. 9 and 10 is a liquid-to-air membrane energy exchanger (LAMEE). ECwi is the water at the inlet of the evaporative cooler. ECwo is the water at the outlet of the evaporative cooler. ECai is the air at the inlet of the evaporative cooler. ECao is the air at the outlet of the evaporative cooler. Similarly, RCwi is the water at the inlet of the recovery coil, and RCwo is the water at the outlet of the evaporative cooler. RCai is the air at the inlet of the evaporative cooler. RCao is the air at the outlet of the evaporative cooler.

In the adiabatic mode, the water circuits for the EC and the RC are generally separate. In the adiabatic mode shown in FIG. 9, the majority of the heat rejection is occurring in the recovery coil. The fans have to ramp up to a scavenger air flow rate of 35,000 ACFM. In contrast, in the evaporative mode shown in FIG. 10, the majority of the cooling is provided by the evaporative cooler. The water at the inlet of the evaporative cooler is the same as the water at the outlet of the RC, as shown in FIG. 10. The water outlet temperature of the evaporative cooler is not visible in FIG. 10 since it is at or near the set point temperature of 26.7 degrees Celsius. Although the fans can be ramped down in the evaporative mode to a scavenger air flow rate of 10,400 ACFM, the conditioning unit consumes much more water under the evaporative mode shown in FIG. 10, as compared to the adiabatic mode of FIG. 9.

FIGS. 9 and 10 illustrate the operating extremes of the adiabatic mode and the evaporative mode under a particular set of outdoor air conditions in which each mode can handle the heat load but at the expense of power consumption or water consumption. Moreover, switching from the adiabatic mode to the evaporative mode or vice versa as the outdoor air conditions change can result in significant changes in how the conditioning unit is operated. The blended operation mode can provide significant advantages when it is used in the outdoor or ambient air conditions shown in FIGS. 9 and 10. The blended operation mode can provide finer control and stability and can continue to be used as changes in the outdoor air changes are occurring, without having to fully cross over from the adiabatic mode to the evaporative mode or vice versa.

The capability to operate in the blended mode, as described herein, is applicable to any operation with evaporative cooling or cooling towers. In addition to the advantages provided above, such blended mode can provide smooth control of the unit cooling capacity and supply water temperature in the wet mode of operation. As such, the supply water temperature can be controlled more precisely.

Figure 11:
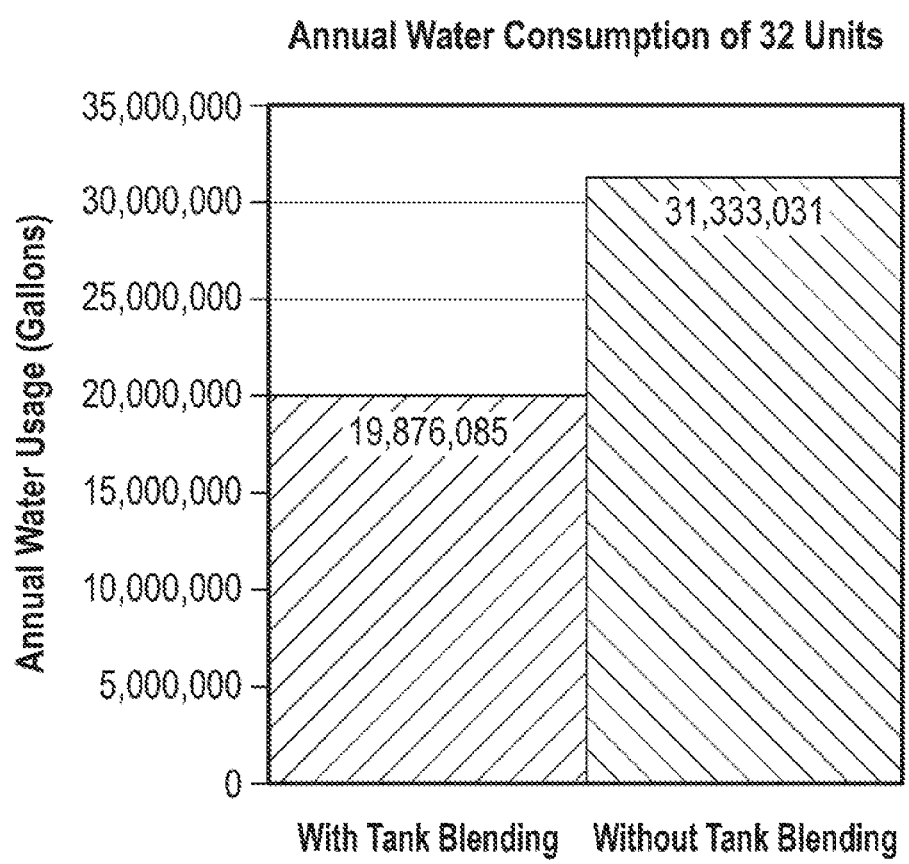
FIG. 11 is a chart comparing annual water usage of two different conditioning systems.

The blended mode can result in higher annual water usage efficiency of the conditioning unit or overall conditioning system. FIG. 11 shows modeling results of the annual water consumption of two systems, each of which have 32 units. Each of the 32 units can be similar to the conditioning unit 10 of FIG. 1 and the evaporative cooler can include a LANIEE. The system with the tank blending capabilities described herein is projected to consume 19.9 million gallons of water annually. The system without tank blending is projected to consume 31.3 million gallons of water annually. Thus the system having multiple units with a blended operation mode exhibited more than a 35% reduction in annual water usage as compared to a conditioning system having the same number of units, but without blended operation.

Figure 12:
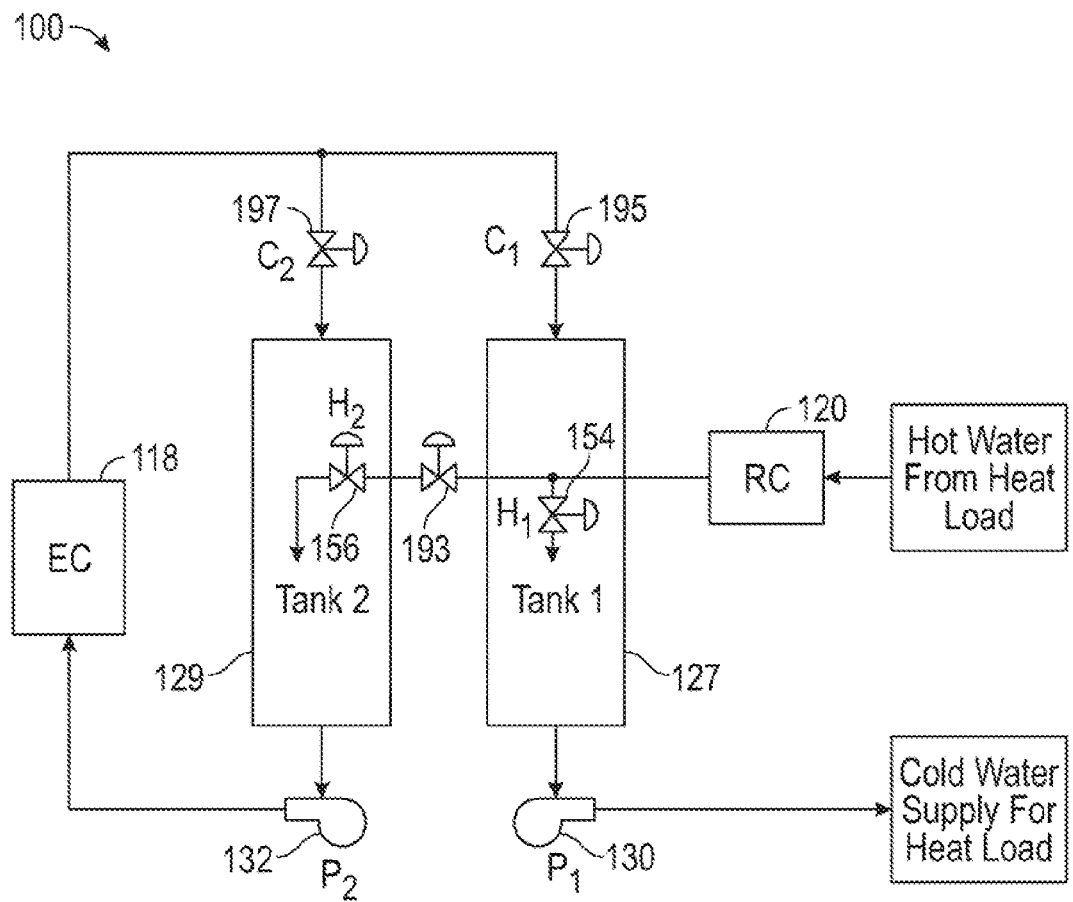
FIG. 12 is a simplified schematic of another example conditioning unit.

FIG. 12 is a simplified schematic (similar to FIG. 8) of a conditioning unit 100 that can be configured and operate similarly to the conditioning unit 10. The conditioning unit 100 can include an evaporative cooler 118 (EC) and a recovery coil 120 (RC). It is recognized that, like the conditioning unit 100 having multiple evaporative coolers and multiple recovery coils (see FIG. 1), EC 118 and RC 120 of FIG. 12 can represent one or more of that particular component. Also, the conditioning unit 100 can include one or more pre-coolers (see the pre-coolers 16 of FIG. 1) even though not included in FIG. 8.

Instead of a single tank design, the conditioning unit 100 can include two tanks—a first tank 127 and a second tank 129. The two tanks 127, 129 can be used to regulate a flow of hot water from the RC 120 into each of the tanks 127, 129, as well as to regulate a flow of cold water from the EC 118 into each of the tanks 127, 129. The conditioning unit 100 can include a system controller similar to the controller 38 of the conditioning unit 10. The conditioning unit 100 can include an equalization valve 193 located between the first and second tanks 127, 129.

The first tank 127 can be referred to as the "cold" tank since the water from the first tank 127 is delivered via a first pump 130 as the cold water supply for the heat load. The second tank 129 can be referred to as the "hot" tank since the water from the second tank 129 is delivered via a second pump 132 for recirculation through the EC 118. The flow of RC return water from the recovery coil 20 to the first and second tanks 127, 129 can generally be the same as described above in reference to the delivery of RC return water to the first and second pump suction bays 40, 42 of the tank 28. FIG. 12 includes a first valve 154 for the first tank 127 and a second valve 156 for the second tank 129. The first valve 154 can be a first hot water valve (H1) and the second valve 156 can be a second hot water valve (H2). It is recognized that in another example, the unit 100 can include a three-way modulating valve for varying and controlling the flow of RC return water to the first and second tanks 127, 129.

The conditioning unit 100 can include two cold water valves—a first cold water valve 195 and a second cold water valve 197. The first cold water valve 195 can be configured to deliver EC water to the first tank 127 and the second cold water valve 197 can be configured to deliver EC water to the second tank 129. The system controller for the conditioning unit 100 can vary and control the amounts of cold water delivered into each of the tanks 127, 129, depending on an operating mode of the unit 100.

In an economizer mode, the RC return water can flow through the valve 154 and into the first tank 127 and then can be pumped to the cold water main using the pump 130. The outdoor air conditions under the economizer mode can be such that the RC return water can be used as cold water supply for the heat load.

In an adiabatic mode, the first tank 127 can continue to operate as described in the paragraph immediately above in reference to the economizer mode. The second tank 129 can be filled with the water exiting the EC 118 and the second pump 132 can recirculate the water from the second tank 129 back through the EC 118. The equalization valve 193 can remain closed during operation in the adiabatic mode. As similarly described above for operation of the unit 10 in the adiabatic mode, the water circuits for the recovery coil 120 and the evaporative cooler 118 can remain essentially separate from one another in the adiabatic mode. The level in the second tank 129 can be sensed via a sensor and make up water can be supplied to the second tank 129 as needed.

In an evaporative mode, the equalization valve 193 can be open to fluidly connect the two tanks 127, 129 and the RC return water can be supplied to the second tank 129 through the second valve 156. The EC water can be delivered into the first tank 127 via the first cold water valve 195 at a flow rate in proportion to the pumping rate of the first pump 130. Any remaining EC water can flow into the second tank 129 via the second cold water valve 197. Overall tank operating level can be controlled by a RC-fill valve similar to the RC fill valve 96 of FIG. S.

In a blended operation mode, between the adiabatic mode and the evaporative mode, the first and second hot water valves 154, 156 can be modulated to vary the distribution of the RC return water to the first and second tanks 127, 129. As described above in reference to the unit 10 and a single tank design, the blended operation mode can continuously monitor and adjust the distribution of the RC return water to the first and second tanks 127, 129 such that the cold water supply temperature to the heat load (as delivered from the tank 127 via the pump 130) is at or near the set point temperature. In an example, the distribution ratio can be continuously varied (and finely tuned) and the scavenger air flow rate through the conditioning unit can be relatively constant. Under the blended operation mode, the mix of hot return water from the RC 120 and cold discharge water from the EC 118 can be adjusted such that the water supply temperature is at or near the set point temperature. The amount of cold discharge water entering each of the tanks 127, 129 can depend in part on the amount of hot return water entering each of the tanks 127, 129 via the valves 154, 156.

In the single tank design, the back end or discharge area of the tank 28 can receive the EC discharge water or cold water, and such discharge area of the tank 28 can be fluidly connected to each of the first and second bays 40, 42 of the tank. In the two-tank design, each tank 127, 129 can include a discharge area that can be in fluid connection with the area of the tank 127, 129 that receives the RC return water via the valves 154, 156.

In an example, the first and second tanks 127, 129 can be wholly separate structures from one another. In another example, the first and second tanks 127, 129 can be part of the same structure, but physically separated by a wall or other physical divider that runs a length of the tanks 127 and 129 (as compared to the dividing baffle 48 of the tank 28 which does not run an entire length of the tank 28).

The two-tank design shown in FIG. 12 may provide better thermal isolation as compared to the tank 28, since the two-tank design can prevent undesirable mixing of the cold and hot water under particular operating modes. The two-tank design can include additional equipment, including an additional tank, piping and valves, and consequently additional parameters to control, relative to the single tank design.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The present application provides for the following exemplary embodiments or examples, the numbering of which is not to be construed as designating levels of importance:

Example 1 provides a method of controlling operation of a conditioning system for providing cooling to a heat load, the conditioning system having an evaporative cooler and a downstream recovery coil arranged inside a scavenger plenum configured to direct scavenger air from an air inlet to an air outlet, and the method comprising: selectively directing scavenger air through the evaporative cooler depending on outdoor air conditions, wherein the evaporative cooler circulates water through the evaporative cooler during operation of the evaporative cooler; directing the scavenger air through the recovery coil, wherein the recovery coil circulates water through the recovery coil; selectively directing discharge water exiting the evaporative cooler into a discharge area of a storage tank, the water from the tank used to provide cooling to the heat load; directing return water exiting the recovery coil into at least one of a first bay and a second bay of the tank, wherein a first pump is fluidly connected to a first outlet of the tank in proximity to the first bay and a second pump is fluidly connected to a second outlet of the tank in proximity to the second bay, selectively directing water out of the tank and back to the evaporative cooler via the second pump; directing supply water out of the tank and to the heat load via the first pump; and directing hot water exiting the heat load back to the recovery coil. The first and second bays are at least partially separated from one another, and the discharge area of the tank is fluidly connected to at least one of the first and second bays.

Example 2 provides the method of Example 1 and optionally wherein directing return water exiting the recovery coil into at least one of the first bay and the second bay of the tank includes controlling the distribution of return water to the first bay and the second bay based on the outdoor air conditions.

Example 3 provides the method of Example 2 and optionally wherein the flow path from the recovery coil to the tank includes a three-way modulating valve to control the distribution of return water to the first bay and the second bay.

Example 4 provides the method of Example 2 and optionally wherein the flow path from the recovery coil includes a first pipe to the first bay and a second pipe to the second bay, and a modulating valve for each pipe to control the flow of water to the first and second bays of the tank.

Example 5 provides the method of any of Examples 1-4 and optionally further comprising measuring a temperature of the supply water being directed out of the tank via the first pump.

Example 6 provides the method of Example 5 and optionally wherein directing return water exiting the recovery coil into at least one of a first bay and a second bay of the tank includes adjusting a distribution of the return water to the first and second bays as a function of the measured temperature of the supply water relative to a set point temperature.

Example 7 provides the method of Example 6 and optionally wherein the set point temperature is a function of the heat load.

Example 8 provides the method of any of Examples 1-7 and optionally further comprises selectively directing scavenger air through a pre-cooler arranged inside the scavenger plenum upstream of the evaporative cooler to pre-condition the scavenger air depending on the outdoor air conditions.

Example 9 provides the method of any of Examples 1-8 and optionally directing return water exiting the recovery coil into at least one of a first bay and a second bay includes selectively flowing the return water into at least one of a first discharge pipe inside the first bay and a second discharge pipe inside the second bay.

Example 10 provides the method of Example 9 and optionally wherein the first and second discharge pipes are oriented in parallel with a length of the tank and each pipe includes an elongated slot formed on an exterior of the discharge pipe to release the return water from the discharge pipe and into the respective bay.

Example 11 provides the method of any of Examples 1-10 and optionally wherein directing return water exiting the recovery coil into at least one of a first bay and a second bay includes selectively flowing the return water into a diffuser baffle inside each of the first and second bays.

Example 12 provides the method of Example 11 and optionally wherein directing return water exiting the recovery coil into at least one of a first bay and a second bay includes selectively flowing the return water into an elbow connected to the diffuser baffle, the elbow configured to direct the return water and decrease a velocity of the return water flowing into the first and second bays.

Example 13 provides the method of any of Examples 1-12 and optionally further comprising operating the conditioning system in an economizer mode in which the evaporative cooler is off, and the scavenger air bypasses the evaporative cooler in the economizer mode.

Example 14 provides the method of any of Examples 1-13 and optionally further comprising operating the conditioning system in an adiabatic mode in which the discharge water directed to the back end of the tank is recirculated to the evaporative cooler via the second pump and essentially all of the return water from the recovery coil is directed to the first bay for use as supply water.

Example 15 provides the method of any of Examples 1-14 and optionally further comprising operating the conditioning system in an evaporative mode in which essentially all of the return water from the recovery coil is directed to the second bay and the discharge water from the evaporative cooler flows to the first bay for use as supply water.

Example 16 provides the method of any of Examples 1-15 and optionally further comprising operating the conditioning system in a blended mode in which the return water exiting the recovery coil is distributed to both the first bay and the second bay.

Example 17 provides the method of Example 16 and optionally wherein distribution of the return water to the first bay and the second bay is continuously modulated by a controller of the conditioning system to maintain a set point temperature of the supply water directed to the heat load from the first pump.

Example 18 provides the method of any of Examples 1-17 and optionally further comprising partially separating the first bay and the second bay of the tank with a dividing baffle in the tank, wherein the dividing baffle extends along a portion of a length of the tank.

Example 19 provides the method of any of Examples 1-18 and optionally wherein the first and second outlets are at a front end of the tank, and the discharge area is at a back end of the tank opposite to the front end.

Example 20 provides the method of any of Examples 1-17 and optionally wherein the first and second bays are separate structures.

Example 21 provides the method of Example 20 and optionally wherein the tank comprises an equalization valve to fluidly connect the first and second bays, and wherein the cooling fluids in the first and second bays are separate from one another when the equalization valve is closed.

Example 22 provides the method of any of Examples 1-21 and optionally wherein directing return water exiting the recovery coil into at least one of the first bay and the second bay of the tank includes controlling a velocity of the return water to the first bay and the second bay to minimize turbulence.

Example 23 provides a conditioning system configured to provide cooling to a heat load, the system comprising: a scavenger plenum having an air inlet and air outlet, the scavenger plenum configured to direct scavenger air in an air flow path from the air inlet to the air outlet; an evaporative cooler arranged inside the scavenger plenum in the air flow path and having a first cooling fluid circuit configured to circulate a first cooling fluid through the evaporative cooler, the evaporative cooler configured to selectively evaporate a portion of the first cooling fluid when the conditioning system is operating in an adiabatic mode or an evaporative mode, and the evaporative cooler is off or bypassed when the conditioning system is operating in an economizer mode; a recovery coil arranged inside the scavenger plenum between the evaporative cooler and the air outlet and having a second cooling fluid circuit configured to circulate a second cooling fluid through the recovery coil, the recovery coil configured to reduce a temperature of the second cooling fluid using the scavenger air in the air flow path, wherein the recover coil provides sufficient cooling for the heat load in the economizer mode; and a tank for releasably storing the first and second cooling fluids for selective delivery of the cooling fluids to the heat load as supply water and to the evaporative cooler for recirculation, the tank comprising a first portion and a second portion, the first and second portions at least partially separated from one another, and the tank further comprising a discharge area in fluid connection with at least one of the first and second portions; and one or more modulating valves fluidly connecting the recovery coil and the tank, the one or more modulating valves configured to control and vary distribution of the second cooling fluid to the first and second portions of the tank based on the outdoor air conditions, wherein the first cooling fluid exiting the evaporative cooler is directed into the discharge area of the tank.

Example 24 provides the system of Example 23 and optionally further comprising a sensor to measure a temperature of the supply water to the heat load and a controller configured to maintain the temperature of the supply water at or near a set point temperature for the heat load.

Example 25 provides the system of Example 24 and optionally wherein the controller adjusts a position of the one or more modulating valves to vary the distribution of the second cooling fluid to the first and second portions of the tank when the conditioning system operates in a blended operation mode between the adiabatic mode and the evaporative mode.

Example 26 provides the system of any of Examples 23-25 and optionally further comprising a first pump in fluid connection with the first portion of the tank and configured to deliver supply water to the heat load; and a second pump in fluid connection with the second portion of the tank and configured to deliver water from the second portion of the tank to the evaporative cooler.

Example 27 provides the system of any of Examples 23-26 and optionally wherein the first and second portion of the tank are separate structures.

Example 28 provides the system of Example 27 and optionally wherein the tank comprises an equalization valve to fluidly connect the first and second portions of the tank under particular operating modes, and wherein the cooling fluids in the first and second portions of the tank are separate from one another when the equalization valve is closed.

Example 29 provides the system of Example 28 and optionally wherein the discharge area of the tank comprises a first discharge area in fluid connection with the first portion of the tank and a second discharge area in fluid connection with the second portion of the tank.

Example 30 provides the system of Example 29 and optionally wherein the first cooling fluid exiting the evaporative cooler is directed into the second discharge area when the conditioning system is operating in the adiabatic mode.

Example 31 provides the system of Example 29 and/or 30 and optionally wherein at least a portion of the first cooling fluid exiting the evaporative cooler is directed into the first discharge area when the conditioning system is operating in the evaporative mode.

Example 32 provides the system of any of Examples 23-31 and optionally wherein the first portion of the tank comprises a first discharge pipe in fluid connection with the recovery coil to selectively deliver the second cooling fluid to the first portion of the tank, and the second portion of the tank comprises a discharge pipe in fluid connection with the recovery coil to selectively deliver the second cooling fluid to the second portion of the tank.

Example 33 provides the system of Example 32 and optionally wherein the first and second discharge pipes each comprise an elongated slot to deliver the second cooling fluid to the first and second portions of the tank.

Example 34 provides the system of any of Examples 23-26 or 32-33 and optionally wherein the tank further comprises a dividing baffle in the tank that partially separates the first portion and the second portion from one another, and the dividing baffle extends along a portion of a length of the tank.

Example 35 provides the system of any of Examples 23-26 and 32-34 and optionally wherein the tank further comprises a first diverter and a second diverter to partially separate the discharge area of the tank from the first and second portions of the tank.

Example 36 provides the system of any of Examples 23-35 and optionally wherein the first and second cooling fluids are water.

Example 37 provides the system of any of Examples 23-36 and optionally wherein the evaporative cooler is a liquid-to-air membrane energy exchanger (LAMEE), and the first cooling fluid is separated from the air flow path by a membrane, the LAMEE configured to condition the scavenger air and evaporatively cool the first cooling fluid.

Example 38 provides the system of any of Examples 23-37 and optionally further comprising a pre-cooler arranged inside the scavenger plenum between the air inlet and the evaporative cooler, the pre-cooler configured to selectively condition the scavenger air prior to passing the scavenger air through the evaporative cooler, based on the outdoor air conditions.

Example 39 provides a method of operating a conditioning system configured to provide cooling to a head load, the method comprising: operating the conditioning system in an economizer mode in which the evaporative cooler is off or bypassed and the scavenger air stream reduces a temperature of a first cooling fluid flowing through the recovery coil such that the first cooling fluid provides sufficient cooling to the heat load; releasably storing the first cooling fluid in a tank; directing the first cooling fluid exiting the recovery coil into at least one of a first portion and a second portion of the tank when the conditioning system is operating in the economizer mode, the first and second portions at least partially separated from one another, the first portion fluidly connected to a first pump for delivering supply water to the heat load and the second portion fluidly connected to a second pump for recirculating water to the evaporative cooler; operating the conditioning system in an adiabatic mode in which the evaporative cooler is on and the scavenger air stream passes through the evaporative cooler and the recovery coil, the evaporative cooler configured to evaporate a portion of a second cooling fluid flowing through the evaporative cooler, the evaporative cooler having a closed fluid circuit in the adiabatic mode; directing essentially all of the first cooling fluid exiting the recovery coil into the first portion of the tank when the conditioning system is operating in the adiabatic mode; operating the conditioning system in an evaporative mode in which the evaporative cooler is on and the scavenger air stream passes through the evaporative cooler and the recovery coil, wherein the second cooling fluid is in fluid connection with the first cooling fluid when the conditioning system operates in the evaporative mode; directing the second cooling fluid exiting the evaporative cooler into a discharge area of the tank when the conditioning system is operating in the evaporative mode; directing essentially all of the first cooling fluid exiting the recovery coil into the second portion of the tank when the conditioning system is operating in the evaporative mode, whereby the second cooling fluid flows from the discharge area of the tank into the first portion; and operating the conditioning system in a blended mode at particular operating conditions between the adiabatic mode and the evaporative mode, wherein operating the conditioning system in the blended mode comprises distributing the first cooling fluid exiting the recovery coil between the first and second portions of the tank in a ratio such that a mix of the first and second cooling fluids in the supply water delivered to the heat load is at a temperature at or near a set point temperature for the conditioning system.

Example 40 provides the method of Example 39 and optionally wherein operating the conditioning system in the blended mode includes continuously monitoring and varying the ratio of the first cooling fluid distributed to the first and second portions of the tank to maintain the temperature of the supply water at or near the set point temperature.

Example 41 provides the method of Example 39 and/or 40 and optionally wherein operating the conditioning system in the blended mode comprises modulating the flow of the first cooling fluid to the first portion of the tank and to the second portion of the tank using one or more modulating valves in fluid connection with the first cooling fluid exiting the recovery coil.

Example 42 provides the method of any of Examples 39-41 and optionally further comprising directing the second cooling fluid from the evaporative cooler into the second portion of the tank when the conditioning system is operating in the adiabatic mode.

Example 43 provides the method of any of Examples 39-42 and optionally further comprising selectively directing the scavenger air stream through a pre-cooler arranged inside the scavenger plenum between the air inlet and the evaporative cooler, the pre-cooler configured to selectively condition the scavenger air prior to passing the scavenger air through the evaporative cooler, based on the outdoor air conditions.

Example 44 provides a system or method of any one or any combination of Examples 1-43, which can be optionally configured such that all steps or elements recited are available to use or select from.

Various aspects of the disclosure have been described. These and other aspects are within the scope of the following claims.

What is claimed:

1. A method of controlling operation of a conditioning system configured to provide cooling to a heat load, the method comprising: selectively directing scavenger air and a cooling liquid through an evaporative cooler arranged inside a scavenger plenum based on outdoor air conditions; directing the scavenger air and the cooling liquid through a cooling coil arranged inside the scavenger plenum downstream of the evaporative cooler; selectively directing the cooling liquid from a liquid outlet of the evaporative cooler into a first portion of a reservoir; directing the cooling liquid from a liquid outlet of the LAHX to one or more of a second portion of the reservoir having a first reservoir outlet and a third portion of the reservoir having a second reservoir outlet; controlling a proportion of the cooling liquid from the liquid outlet of the LAHX that is directed to the second and third portions of the reservoir; directing the cooling liquid from the first reservoir outlet to the heat load; directing the cooling liquid heated by the heat load from the heat load to a liquid inlet of the LAHX; and selectively directing the cooling liquid from the second reservoir outlet to a liquid inlet of the evaporative cooler, wherein the second and third portions of the reservoir are at least partially fluidly separated from one another, and the first portion of the reservoir is fluidly connected to the second and third portions of the reservoir.

2. The method of claim 1, wherein: directing the cooling liquid from the liquid outlet of the cooling coil comprises directing the cooling liquid through one or more modulating valves.

3. The method of claim 2, wherein: controlling a proportion of the cooling liquid from the liquid outlet of the cooling coil comprises actuating one or more of the one or more modulating valves.

4. The method of claim 1 wherein directing the cooling liquid from a liquid outlet of the cooling coil to one or more of a second portion of the reservoir having a first reservoir outlet and a third portion of the reservoir having a second reservoir outlet includes controlling the distribution of cooling liquid to the second portion and the third portion based on the outdoor air conditions.

5. The method of claim 4 wherein a flow path from the cooling coil to the reservoir includes a three-way modulating valve to control the distribution of cooling liquid to the second portion and the third portion.

6. The method of claim 4 wherein a flow path from the cooling coil includes a first pipe to the second portion and a second pipe to the third portion, and a modulating valve for each pipe to control the flow of cooling fluid to the second portion and the third portion.

7. The method of claim 1 further comprising:
selectively directing scavenger air through a pre-cooler arranged inside the scavenger plenum upstream of the evaporative cooler to pre-condition the scavenger air depending on the outdoor air conditions.

8. The method of claim 1 wherein directing the cooling liquid from a liquid outlet of the cooling coil to one or more of a second portion of the reservoir having a first reservoir outlet and a third portion of the reservoir having a second reservoir outlet includes selectively flowing the cooling liquid into at least one of a first discharge pipe inside the second portion and a second discharge pipe inside the third portion.

9. The method of claim 1 wherein directing the cooling liquid from a liquid outlet of the cooling coil to one or more of a second portion of the reservoir having a first reservoir outlet and a third portion of the reservoir having a second reservoir outlet includes selectively flowing the cooling liquid into a diffuser baffle inside each of the second and third portions.

10. The method of claim 1 further comprising operating the conditioning system in an economizer mode in which the evaporative cooler is off, and the scavenger air bypasses the evaporative cooler.

11. The method of claim 1 further comprising operating the conditioning system in an adiabatic mode in which the cooling liquid directed from the liquid outlet of the evaporative cooler into the first portion of the reservoir is recirculated to the evaporative cooler and essentially all of the cooling liquid from the cooling coil is directed to the second portion to be directed through the first reservoir outlet to the heat load.

12. The method of claim 1 further comprising operating the conditioning system in an evaporative mode in which essentially all of the cooling liquid from the cooling coil is directed to the third portion and the cooling liquid from the liquid outlet of the evaporative cooler flows to the second portion to be directed through the first reservoir outlet to the heat load.

13. The method of claim 1 further comprising operating the conditioning system in a blended mode in which the cooling liquid from the liquid outlet of the cooling coil is distributed to both the second portion sand the third portion.

14. The method of claim 1 further comprising partially separating the second portion and the third portion of the reservoir with a dividing baffle, wherein the dividing baffle extends along a portion of a length of the reservoir.

15. A conditioning system configured to provide cooling to a heat load, the conditioning system comprising: a scavenger plenum having an air inlet and air outlet, the scavenger plenum configured to direct scavenger air in an air flow path from the air inlet to the air outlet; an evaporative cooler arranged inside the scavenger plenum in the air flow path and having a first cooling fluid circuit configured to circulate a first cooling fluid through the evaporative cooler; a cooling coil arranged inside the scavenger plenum between the evaporative cooler and the air outlet and having a second cooling fluid circuit configured to circulate a second cooling fluid through the cooling coil; a reservoir having a first portion and a second portion at least partially fluidically separated from one another, and a discharge area in fluid connection with the first and second portions; and one or more modulating valves fluidly connecting the cooling coil and the reservoir, wherein: the reservoir is configured to releasably store the first and second cooling fluids for selective delivery of the cooling fluids to the heat load and to the evaporative cooler for recirculation; the first cooling fluid exiting the evaporative cooler is directed into the discharge area of the reservoir; and the one or more modulating valves are configured to control and vary distribution of the second cooling fluid to the first and second portions of the reservoir based on the outdoor air conditions.

* * * * *